United States Patent
Endo et al.

(10) Patent No.: US 8,106,391 B2
(45) Date of Patent: Jan. 31, 2012

(54) ORGANIC EL DEVICE

(75) Inventors: Jun Endo, Sodegaura (JP); Kenichi Fukuoka, Sodegaura (JP); Toshihiro Iwakuma, Sodegaura (JP); Chishio Hosokawa, Sodegaura (JP); Tadahiko Yoshinaga, Tokyo (JP); Emiko Kambe, Tokyo (JP); Yasunori Kijima, Tokyo (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 203 days.

(21) Appl. No.: 12/670,490

(22) PCT Filed: Sep. 26, 2008

(86) PCT No.: PCT/JP2008/067523
§ 371 (c)(1), (2), (4) Date: Jan. 25, 2010

(87) PCT Pub. No.: WO2009/041635
PCT Pub. Date: Apr. 2, 2009

(65) Prior Publication Data
US 2010/0219404 A1 Sep. 2, 2010

(30) Foreign Application Priority Data
Sep. 28, 2007 (JP) ................. 2007-256308

(51) Int. Cl.
*H01L 51/00* (2006.01)
*H01L 51/30* (2006.01)
(52) U.S. Cl. ............ 257/40; 257/E51.018; 257/E51.026
(58) Field of Classification Search .................. 257/40, 257/E51.018, E51.026, E51.027
See application file for complete search history.

(56) References Cited

U.S. PATENT DOCUMENTS

| 6,558,819 B1 * | 5/2003 | Igarashi ................. 428/690 |
| 6,670,645 B2 * | 12/2003 | Grushin et al. ............ 257/98 |
| 7,604,874 B2 * | 10/2009 | Kim et al. ................. 428/690 |
| 2005/0031899 A1 * | 2/2005 | Nomura et al. .............. 428/690 |
| 2007/0160905 A1 | 7/2007 | Morishita et al. |
| 2007/0231600 A1 * | 10/2007 | Kamatani et al. ........... 428/690 |
| 2010/0084645 A1 * | 4/2010 | Iwaki et al. ............... 257/40 |
| 2011/0017984 A1 * | 1/2011 | Okuda et al. .............. 257/40 |
| 2011/0024733 A1 * | 2/2011 | Steudel et al. ............. 257/40 |
| 2011/0201348 A1 * | 8/2011 | Murray et al. ............ 455/456.1 |
| 2011/0204351 A1 * | 8/2011 | Heim et al. .............. 257/40 |
| 2011/0220885 A1 * | 9/2011 | Rostovtsev et al. .......... 257/40 |

FOREIGN PATENT DOCUMENTS

| JP | 2003229279 A | 8/2003 |
| JP | 2005251639 A | 9/2005 |
| JP | 2007142011 A | 6/2007 |
| JP | 2007169268 A | 7/2007 |
| WO | 2007080801 A1 | 7/2007 |

OTHER PUBLICATIONS

Brien et al., "Improved energy transfer in electrophosphorescent devices", Applied Physics Letters, Jan. 18, 1999, vol. 74, No. 3, pp. 442-444.
Baldo et al., "Very high-efficiency green organic light-emitting devices based on electrophosphorescence", Applied Physics Letters, Jul. 5, 1999, vol. 75, No. 1, pp. 4-6.
Yang et al., "Blue-Emitting Heteroleptic Iridium (III) Complexes Suitable for High-Efficiency Phosphorescent OLEDs", Angewandte Chemie, 2007, 46(14) 233-2544. 2nd Issue.

* cited by examiner

*Primary Examiner* — Victor A Mandala
(74) *Attorney, Agent, or Firm* — Foley & Lardner LLP

(57) ABSTRACT

An organic EL device includes: an anode, a cathode and an organic thin-film layer interposed between the anode and the cathode, in which the organic thin-film layer includes: an emitting layer containing a host material and a phosphorescent material; and a hole transporting layer provided adjacent to the anode relative to the emitting layer. The hole transporting layer includes a first hole transporting layer and a second hole transporting layer that are sequentially layered on the anode, in which the first hole transporting layer contains an amino compound substituted by an aromatic substituent represented by a formula (1) below and the second hole transporting layer contains at least one of compounds represented by formulae (2) to (5) below.
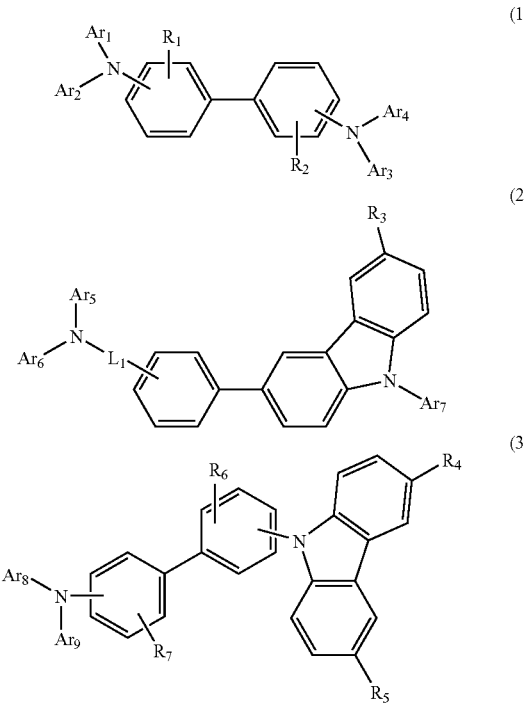
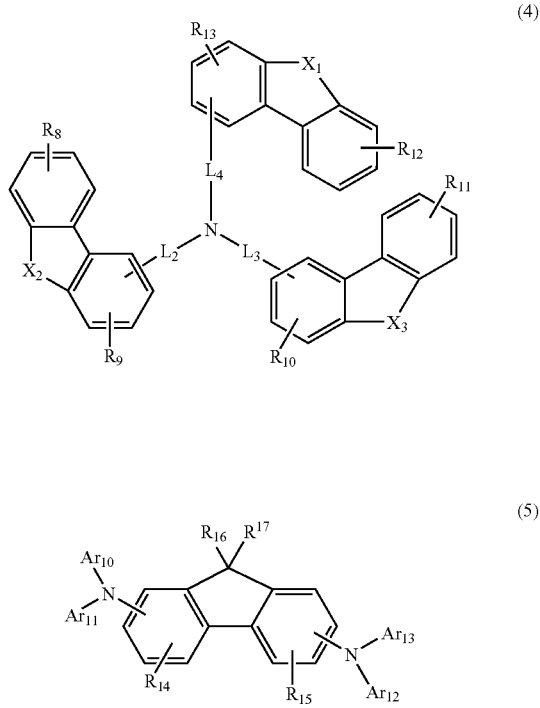
10 Claims, 1 Drawing Sheet

ORGANIC EL DEVICE

CROSS-REFERENCE TO PRIOR APPLICATION

This is the U.S. National Phase Application under 35 U.S.C. §371 of International Patent Application No. PCT/JP2008/067523 filed Sep. 26, 2008, which claims the benefit of Japanese Patent Application No. 2007-256308 filed Sep. 28, 2007, both of which are incorporated by reference herein. The International Application was published in Japanese on Apr. 2, 2009 as WO 2009/041635 A1 under PCT Article 21(2).

TECHNICAL FIELD

The present invention relates to an organic EL device. Particularly, the present invention relates to a phosphorescent organic EL device having high efficiency and long lifetime.

BACKGROUND ART

An organic electroluminescent device (hereinafter, electroluminescent is occasionally abbreviated as EL) is a self-emitting device based on the principle that, when an electrical field is applied, a material emits light using energy generated by a recombination of holes injected from an anode with electrons injected from a cathode.

A typical emitting material used for an organic EL device is a fluorescent material that emits fluorescent light by a singlet exciton. However, recently, it is suggested to use a phosphorescent material that emits phosphorescent light by a triplet exciton instead of the fluorescent material (see, for instance, non-Patent Documents 1 and 2).

When electrons and holes are recombined in an organic EL device, it is presumed that a singlet exciton and a triplet exciton are produced at a rate of 1:3 due to difference in spin multiplicity.

Accordingly, an organic EL device using a phosphorescent material as in non-Patent Documents 1 and 2 can achieve three to four times higher luminous efficiency than an organic EL device that emits light using only fluorescent material.

The phosphorescent material generally exhibits a large excited triplet energy gap (Eg(T)). Accordingly, when the phosphorescent material forms an emitting layer as a dopant, a host material having a larger Eg(T) is used.

Since the host material having a large Eg(T) has a high affinity level (Af), an electron injected from the cathode to the emitting layer is not recombined with a hole in the emitting layer and is likely to be transferred into the anode.

A known method to solve such a problem is to form a hole transporting layer by using a material having a higher Af than the host material of the emitting layer and trapping electrons in the emitting layer.

With this arrangement, electron blocking of the hole transporting layer can enhance probability of recombination of charges in the emitting layer, thereby providing phosphorescent emission with high efficiency.

When the triplet energy gap (Eg(T)) of the hole transporting layer is large, inactivation caused by excited triplet generated in the emitting layer being transferred into the hole transporting layer is unlikely to occur, thereby providing an efficient phosphorescent emission.

However, on electron blocking, the electrons concentrate on an interface between the emitting layer and the hole transporting layer. The concentration of the electron may promote degradation of the materials and reduce lifetime of the device. Accordingly, the hole transporting layer needs to be highly tolerant of the electrons.

Further, as the name implies, the hole transporting layer needs to have capability for transporting holes.

In short, the hole transporting layer of the phosphorescent organic EL device needs to have all of electron blocking capability, electron tolerance and hole transporting capability.

As such a material, tris-4,4',4''-carbazoyl-triphenylamine (TCTA) described in non-Patent Document 3 is typically used, which has not provided sufficient lifetime to the device.

[non-Patent Document 1] Applied Physics letters Vol. 74 No. 3, pp 442-444

[non-Patent Document 2] Applied Physics letters Vol. 75 No. 1, pp 4-6

[non-Patent Document 3] Angewandte Chemie International Edition Vol. 46, 2418-2421

DISCLOSURE OF THE INVENTION

Problems to be Solved by the Invention

An object of the invention is to solve the above problems and provide an organic EL device to emit phosphorescence of high efficiency and long lifetime. Specifically, an object of the invention is to provide a phosphorescent organic EL device in which a hole transporting layer includes a first hole transporting layer and a second transporting layer that are sequentially layered on the anode, the first hole transporting layer being represented by a formula (1) and the second transporting layer being represented by formulae (2) to (5).

Means for Solving the Problems

Intensive researches repeated by the inventors in order to achieve the object described above have resulted in finding that compounds represented by the following formulae (2) to (5) are excellent in electron blocking capability, electron tolerance and hole injecting/transporting capability and an organic EL device to generate phosphorescent emission of high efficiency and long lifetime can be obtained by using the compounds, thus reaching the invention.

An organic EL device according to an aspect of the invention includes: an anode; a cathode; and an organic thin-film layer interposed between the anode and the cathode, in which the organic thin-film layer includes: an emitting layer containing a host material and a phosphorescent material; and a hole transporting layer that is provided adjacent to the anode relative to the emitting layer, in which the hole transporting layer comprises a first hole transporting layer and a second hole transporting layer that are sequentially layered on the anode, the first hole transporting layer containing an amino compound substituted by an aromatic substituent represented by a formula (1) below and the second hole transporting layer containing at least one of compounds represented by formulae (2) to (5) below.

[Chemical Formula 1]

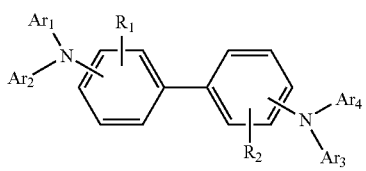

(1)

In the formula (1), $Ar_1$ to $Ar_4$ each are a substituted or unsubstituted phenyl group, a substituted or unsubstituted biphenyl group, a substituted or unsubstituted terphenyl group or a substituted or unsubstituted phenanthrene group.

$Ar_1$ and $Ar_3$ are adapted to be respectively bonded to $Ar_1$ and $Ar_3$ to form a ring.

$R_1$ and $R_2$ each represent hydrogen, a halogen atom, a substituted or unsubstituted alkyl group having 1 to 40 carbon atoms, a substituted or unsubstituted heterocyclic group having 3 to 20 carbon atoms, a substituted or unsubstituted non-condensed aryl group having 6 to 40 carbon atoms, a substituted or unsubstituted condensed aryl group having 6 to 12 carbon atoms, a substituted or unsubstituted condensed/non-condensed-mixed aryl group having 12 to 40 carbon atoms, a substituted or unsubstituted aralkyl group having 7 to 20 carbon atoms, a substituted or unsubstituted alkenyl group having 2 to 40 carbon atoms, a substituted or unsubstituted alkyl amino group having 1 to 40 carbon atoms, a substituted or unsubstituted aralkyl amino group having 7 to 60 carbon atoms, a substituted or unsubstituted alkylsilyl group having 3 to 20 carbon atoms, a substituted or unsubstituted arylsilyl group having 8 to 40 carbon atoms, a substituted or unsubstituted aralkylsilyl group having 8 to 40 carbon atoms, or a substituted or unsubstituted halogenated alkyl group having 1 to 40 carbon atoms.

[Chemical Formula 2]

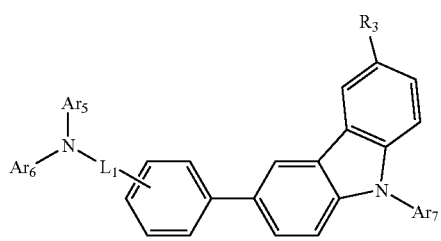

(2)

[Chemical Formula 3]

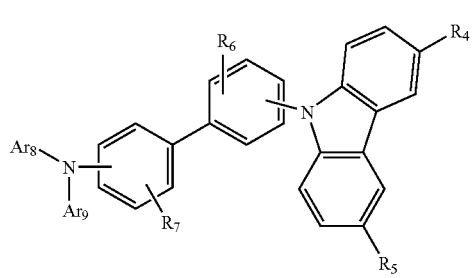

(3)

[Chemical Formula 4]

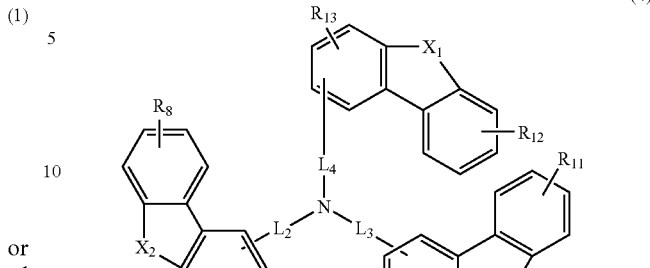

(4)

[Chemical Formula 5]

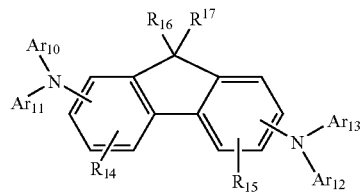

(5)

In the formulae (2) to (5), $Ar_5$ to $Ar_{13}$ are a substituted or unsubstituted aryl group having 5 to 40 carbon atoms, a substituted or unsubstituted aromatic heterocyclic group having 5 to 40 carbon atoms, a substituted or unsubstituted aryl group having 8 to 40 carbon atoms bonded with an aromatic amino group, or a substituted or unsubstituted aryl group having 8 to 40 carbon atoms bonded with an aromatic heterocyclic group.

$Ar_5$, $Ar_8$, $Ar_{10}$ and $Ar_{12}$ are adapted to be respectively bonded to $Ar_6$, $Ar_9$, $Ar_{11}$ and $Ar_{13}$ to form a ring;

$L_1$ is a single bond or a linking group having 1 to 30 carbon atoms and $L_2$ to $L_4$ each are a linking group having 1 to 30 carbon atoms.

$R_3$ to $R_{17}$ each represent hydrogen, a halogen atom, a substituted or unsubstituted alkyl group having 1 to 40 carbon atoms, a substituted or unsubstituted heterocyclic group having 3 to 20 carbon atoms, a substituted or unsubstituted non-condensed aryl group having 6 to 40 carbon atoms, a substituted or unsubstituted condensed aryl group having 6 to 12 carbon atoms, a substituted or unsubstituted condensed/non-condensed-mixed aryl group having 12 to 40 carbon atoms, a substituted or unsubstituted aralkyl group having 7 to 20 carbon atoms, a substituted or unsubstituted alkenyl group having 2 to 40 carbon atoms, a substituted or unsubstituted alkyl amino group having 1 to 40 carbon atoms, a substituted or unsubstituted aralkyl amino group having 7 to 60 carbon atoms, a substituted or unsubstituted alkylsilyl group having 3 to 20 carbon atoms, a substituted or unsubstituted arylsilyl group having 8 to 40 carbon atoms, a substituted or unsubstituted aralkylsilyl group having 8 to 40 carbon atoms, or a substituted or unsubstituted halogenated alkyl group having 1 to 40 carbon atoms.

$X_1$ to $X_3$ each represent a sulfur atom, an oxygen atom or a monoaryl-substituted nitrogen atom.

The compounds represented by the formulae (1) to (5), which exhibit hole injecting/transporting capability, are suitably usable as the hole transporting layer.

Further, the compounds represented by the formulae (1) to (5) each have a high affinity level Af. Accordingly, when these compounds are used for forming the hole transporting layer that is bonded to the phosphorescent emitting layer, the hole transporting layer exhibits an excellent blocking capability.

Furthermore, because all the compounds represented by the formulae (1) to (5) exhibit high electron tolerance, lifetime of the organic EL device is unlikely to be reduced even when electrons concentrate in electron blocking.

An organic EL device according to the aspect of the invention includes: an anode; a cathode; and an organic thin-film layer interposed between the anode and the cathode, in which the organic thin-film layer includes: an emitting layer containing a host material and a phosphorescent material; and a hole transporting layer that is provided adjacent to the anode relative to the emitting layer, in which the hole transporting layer comprises a first hole transporting layer and a second hole transporting layer that are sequentially layered on the anode, the first hole transporting layer containing an amino compound substituted by an aromatic substituent represented by a formula (1) below and the second hole transporting layer containing at least one of compounds represented by formulae (2) to (5) below. Accordingly, the holes can be injected in the emitting layer while the electrons are trapped in the emitting layer, thereby enhancing probability of recombination of charges to obtain phosphorescent'emission with high efficiency.

Although the electrons concentrate on the interface between the emitting layer and the hole transporting layer in electron blocking, lifetime of the emission is unlikely to be reduced because the compounds represented by the formulae (1) to (5) have high electron tolerance.

Here, an affinity level Af (i.e. electron affinity) refers to ejected or absorbed energy when an electron is given to a molecule of a material, which is defined to be positive in the case of ejection and negative in the case of absorption.

The affinity level Af is defined by an ionization potential Ip and an optical energy gap Eg(S) as follows.

$$Af=Ip-Eg(S)$$

Here, the ionization potential Ip refers to energy necessary for a compound of each material to remove electrons to ionize, for which a value measured with an ultraviolet ray photoelectron spectrometer (AC-3 manufactured by Riken Keiki Co., Ltd.).

The optical energy gap Eg(S) refers to a difference between conductive level and covalent electron level, which can, for example, be defined by a wavelength value at an intersection of the tangent line adjacent to a long wavelength of an absorption spectrum and a base line (no absorption) in a solution in which each material is dissolved in toluene being converted into energy value.

Further, the compounds represented by the formulae (1) to (5) have a high glass-transition temperature (Tg) and excellent heat resistance. Particularly, introduction of a substituent having a large molecular weight can enhance heat resistance of the hole transporting layer.

Here, α-NPD which has been typically used as a material for forming the hole transporting layer (see, for instance, US patent 2006-0088728) has Tg of 100 degrees C. or less, whereby heat resistance is insufficient.

On the other hand, the present invention can improve heat resistance of the organic EL device by applying the compounds having a high Tg represented by the formulae (1) to (5).

In the invention of US Patent 2006-0088728, a hole injection layer is formed of copper phthalocyanine compound.

However, since a copper complex compound absorbs wavelength in a visible region, a thickened layer thereof unfavorably becomes bluish. Moreover, since the copper complex compound has low amorphousness and high crystallinity, the copper complex compound has a difficulty in forming a thick layer and is very limitative in arrangement of the device.

On the other hand, the compounds represented by the formulae (1) to (5) do not significantly absorb the wavelength in the visible region and exhibit high amorphousness and low crystallinity, which is therefore suitable for forming a thick layer.

Accordingly, in the organic EL device of the invention, which employs the compounds represented by the formulae (1) to (5), various arrangements of the device are possible.

Examples of the halogen atom of $R_1$ to $R_{17}$ in the above formulae (1) to (5) are fluorine, chlorine, bromine and iodine.

Examples of the substituted or unsubstituted alkyl group having 1 to 40 carbon atoms at $R_1$ to $R_{17}$ in the above formulae (1) to (5) are a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 2-methylpentyl group, 1-pentylhexyl group, 1-butylpentyl group, 1-heptyloctyl group, 3-methylpentyl group, hydroxymethyl group, 1-hydroxyethyl group, 2-hydroxyethyl group, 2-hydroxyisobutyl group, 1,2-dihydoroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 1,2-dinitroethyl group, 2,3-dinitro-t-butyl group, 1,2,3-trinitropropyl group, cyclopentyl group, cyclohexyl group, cyclooctyl group and 3,5-tetramethyl cyclohexyl group.

Among the above, the alkyl group is preferably a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 1-pentylhexyl group, 1-butylpentyl group, 1-heptyloctyl group, cyclohexyl group, cyclooctyl group and 3,5-tetramethyl cyclohexyl group.

Examples of the substituted or unsubstituted heterocyclic group having 3 to 20 carbon atoms at $R_1$ to $R_{17}$ in the above formulae (1) to (5) are a 1-pyroryl group, 2-pyroryl group, 3-pyroryl group, pyrazinyl group, 2-pyridinyl group, 1-imidazolyl, 2-imidazolyl, 1-pyrazolyl, 1-indolidinyl, 2-indolidinyl, 3-indolidinyl, 5-indolidinyl, 6-indolidinyl, 7-indolidinyl, 8-indolidinyl, 2-imidazopyridinyl, 3-imidazopyridinyl, 5-imidazopyridinyl, 6-imidazopyridinyl, 7-imidazopyridinyl, 8-imidazopyridinyl, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, β-carboline-1-yl, β-carboline-3-yl, β-carboline-4-yl, β-carboline-5-yl, β-carboline-6-yl, β-carboline-7-yl, β-carboline-6-yl, β-carboline-9-yl, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, 4-t-butyl-3-indolyl group, 1-dibenzofuranyl group, 2-dibenzofuranyl group, 3-dibenzofuranyl group, 4-dibenzofuranyl group, 1-dibenzothiophenyl group, 2-dibenzothiophenyl group, 3-dibenzothiophenyl group, 4-dibenzothiophenyl group, 1-silafluorenyl group, 2-silafluorenyl group, 3-silafluorenyl group, 4-silafluorenyl group, 1-germafluorenyl group, 2-germafluorenyl group, 3-germafluorenyl group and 4-germafluorenyl group.

Among the above, the heterocyclic group is preferably a 2-pyridinyl group, 1-indolidinyl, 2-indolidinyl, 3-indolidinyl, 5-indolidinyl, 6-indolidinyl, 7-indolidinyl, 8-indolidinyl, 2-imidazopyridinyl, 3-imidazopyridinyl, 5-imidazopyridinyl, 6-imidazopyridinyl, 7-imidazopyridinyl, 8-imidazopyridinyl, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 1-carbazolyl group, 2-carbazolyl group, 3-carbazolyl group, 4-carbazolyl group, 9-carbazolyl group, 1-dibenzofuranyl group, 2-dibenzofuranyl group, 3-dibenzofuranyl group, 4-dibenzofuranyl group, 1-dibenzothiophenyl group, 2-dibenzothiophenyl group, 3-dibenzothiophenyl group, 4-dibenzothiophenyl group, 1-silafluorenyl group, 2-silafluorenyl group, 3-silafluorenyl group, 4-silafluorenyl group, 1-germafluorenyl group, 2-germafluorenyl group, 3-germafluorenyl group and 4-germafluorenyl group.

Examples of the substituted or unsubstituted non-condensed aryl group having 6 to 40 carbon atoms at $R_1$ to $R_{17}$ in the above formulae (1) to (5) are a phenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenyl)-1 group, 4"-t-butyl-p-terphenyl-4-yl group, o-cumenyl group, m-cumenyl group, p-cumenyl group, 2,3-xylyl group, 3,4-xylyl group, 2,5-xylyl group, mesityl group and m-quater-phenyl group.

Among the above, the non-condensed aryl group is preferably a phenyl group, 2-biphenylyl group, 3-biphenylyl group, 4-biphenylyl group, m-terphenyl-4-yl group, m-terphenyl-3-yl group, m-terphenyl-2-yl group, p-tolyl group, 3,4-xylyl group and m-quater-phenyl-2-yl group.

Examples of the substituted or unsubstituted condensed aryl group having 6 to 12 carbon atoms at $R_1$ to $R_{17}$ in the above formulae (1) to (5) are a 1-naphthyl group and 2-naphthyl group.

A substituted or unsubstituted condensed/non-condensed-mixed aryl group having 12 to 40 carbon atoms at $R_1$ to $R_{17}$ in the above formulae (1) to (5) is exemplified by a group in combination of the substituted or unsubstituted condensed aryl group having 6 to 12 carbon atoms with the substituted or unsubstituted non-condensed aryl group having carbon atoms of 6 to 40.

Examples of the substituted or unsubstituted aralkyl group having 7 to 20 carbon atoms at $R_1$ to $R_{17}$ in the above formulae (1) to (5) are a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrorylmethyl group, 2-(1-pyroryl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloro-2-phenylisopropyl group.

Among the above, the aralkyl group is preferably a benzyl group, p-cyanobenzyl group, m-cyanobenzyl group, o-cyanobenzyl group, 1-phenylethyl group, 2-phenylethyl group, 1-phenylisopropyl group and 2-phenylisopropyl group.

Examples of the substituted or unsubstituted alkenyl group having 2 to 40 carbon atoms at $R_1$ to $R_{17}$ in the above formulae (1) to (5) are a vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group, among which a styryl group, 2,2-diphenylvinyl group, 1,2-diphenylvinyl group and the like are preferable.

A substituted or unsubstituted alkyl amino group having 1 to 40 carbon atoms at $R_1$ to $R_{17}$ in the above formulae (1) to (5) and a substituted or unsubstituted aralkyl amino group having 7 to 60 carbon atoms are represented by —$NQ^1Q^2$. Specific examples for each of $Q^1$ and $Q^2$ are the same as the examples described in relation to the alkyl group, the aryl group and the aralkyl group, and preferable examples for each of $Q^1$ and $Q^2$ are also the same as those described in relation to the alkyl group, the aryl group and the aralkyl group.

Examples of the substituted or unsubstituted alkylsilyl group having 3 to 20 carbon atoms at $R_1$ to $R_{17}$ in the above formulae (1) to (5) are a trimethylsilyl group, triethylsilyl group, t-butyldimethylsilyl group, vinyldimethylsilyl group and propyldimethylsilyl group.

Examples of the substituted or unsubstituted arylsilyl group having 8 to 40 carbon atoms at $R_1$ to $R_{17}$ in the above formulae (1) to (5) are a triphenylsilyl group, tribiphenylsilyl group, di-terphenyl-phenylsilyl group, phenyldimethylsilyl group and t-butyldiphenylsilyl group.

Examples of the substituted or unsubstituted aralkylsilyl group having 8 to 40 carbon atoms at $R_1$ to $R_{17}$ in the above formulae (1) to (5) are a tribenzylsilyl group, benzyldimethylsilyl group and t-butyldibenzylsilyl group.

Examples of the substituted or unsubstituted halogenated alkyl group having 1 to 40 carbon atoms at $R_1$ to $R_{17}$ in the above formulae (1) to (5) are a halogenated alkyl group in which at least one hydrogen atom of the alkyl group is substituted by a halogen atom, all of which are suitably used.

Specific examples of the compounds represented by the above formulae (1) to (5) will be shown below, but not limitative.

Examples of the compounds represented by the above formula (1) are as follows.

[Chemical Formula 6]

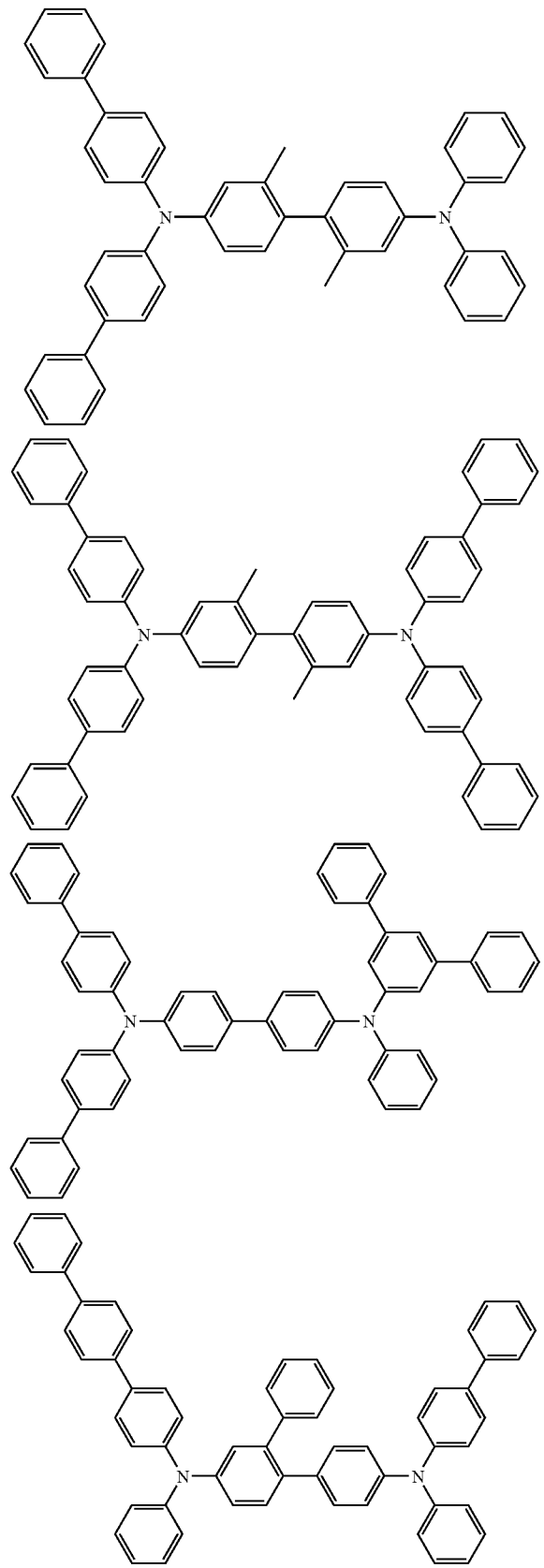

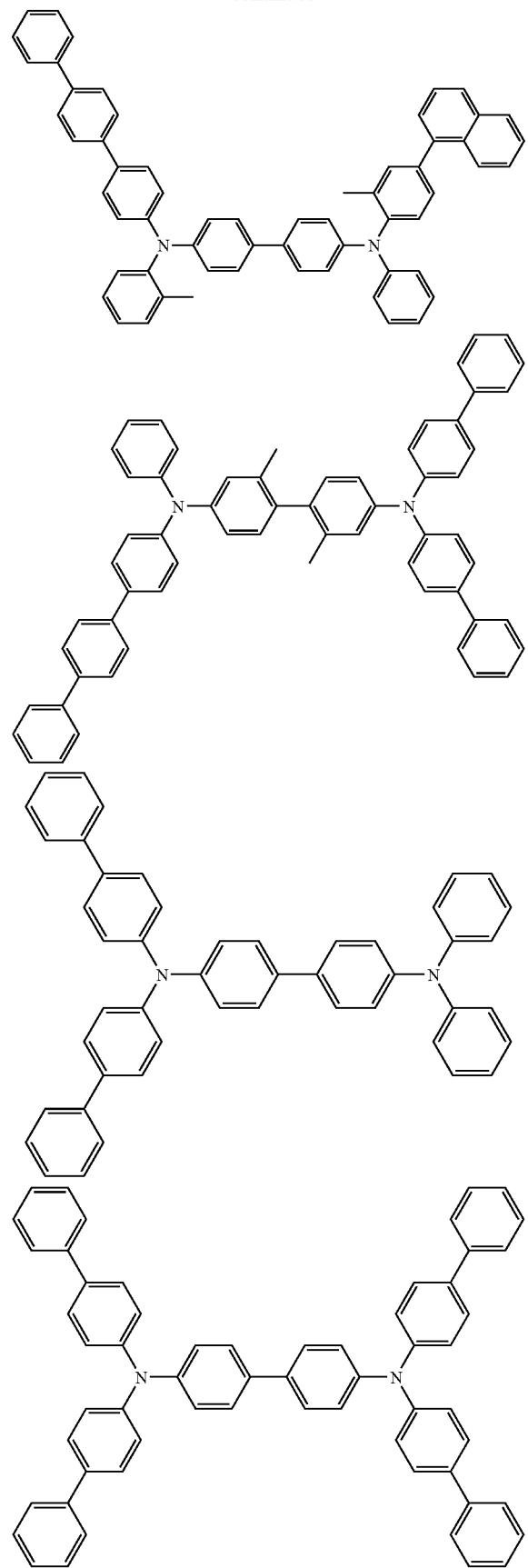
[Chemical Formula 7]
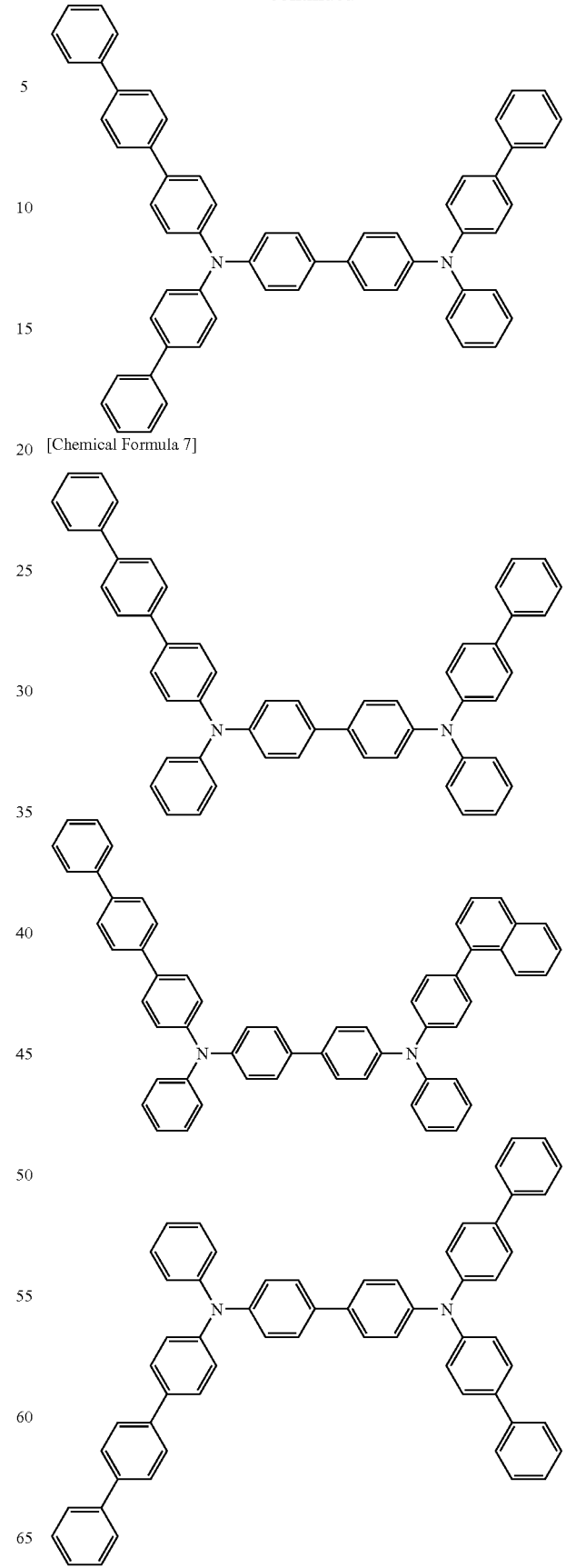

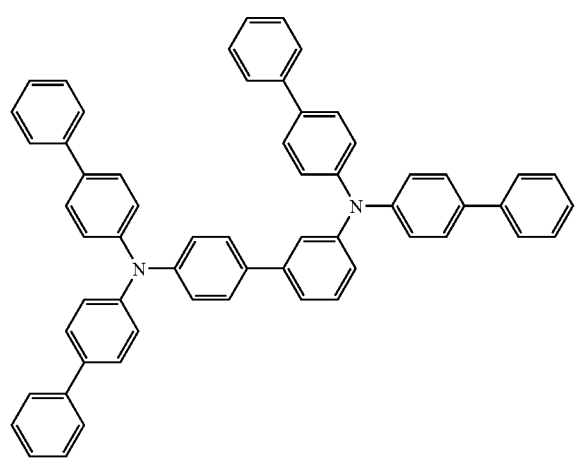
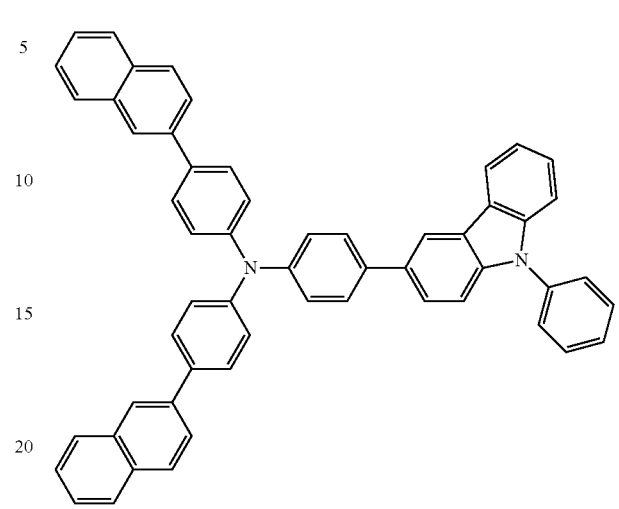
[Chemical Formula 8]
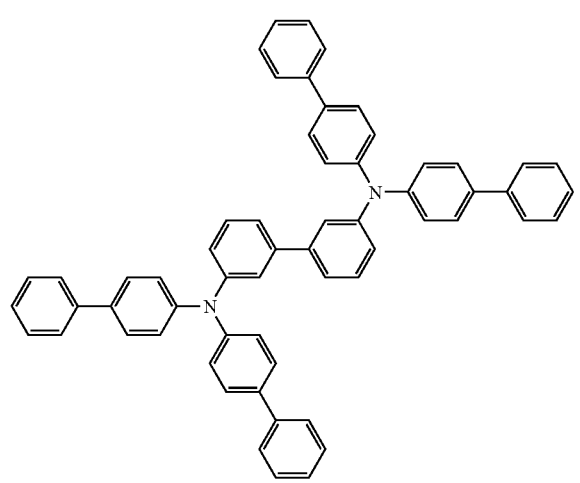
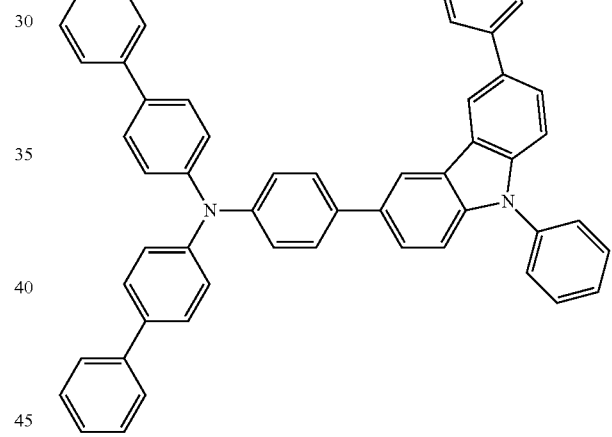
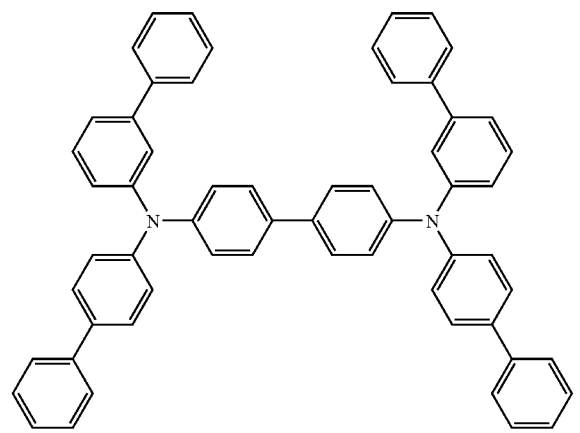
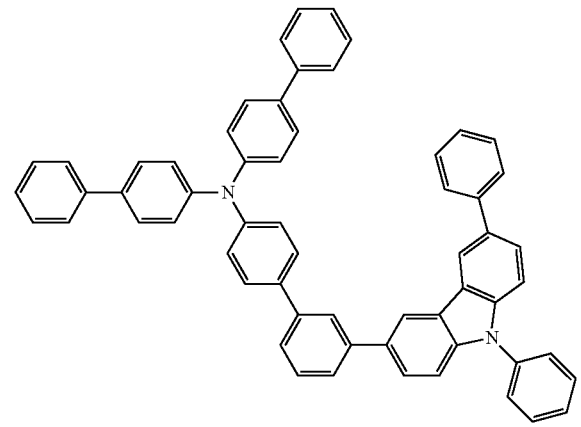
Examples of the compounds represented by the above formula (2) are as follows.

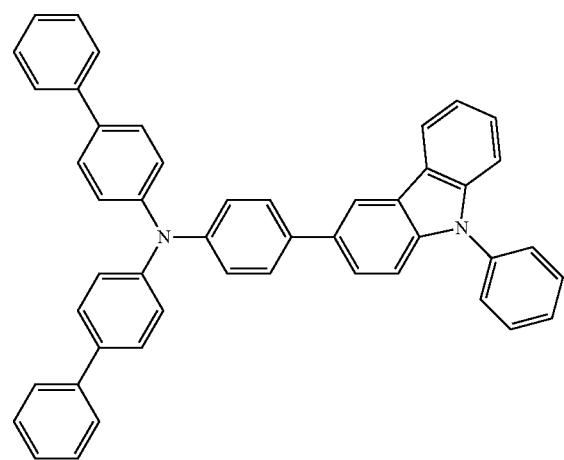
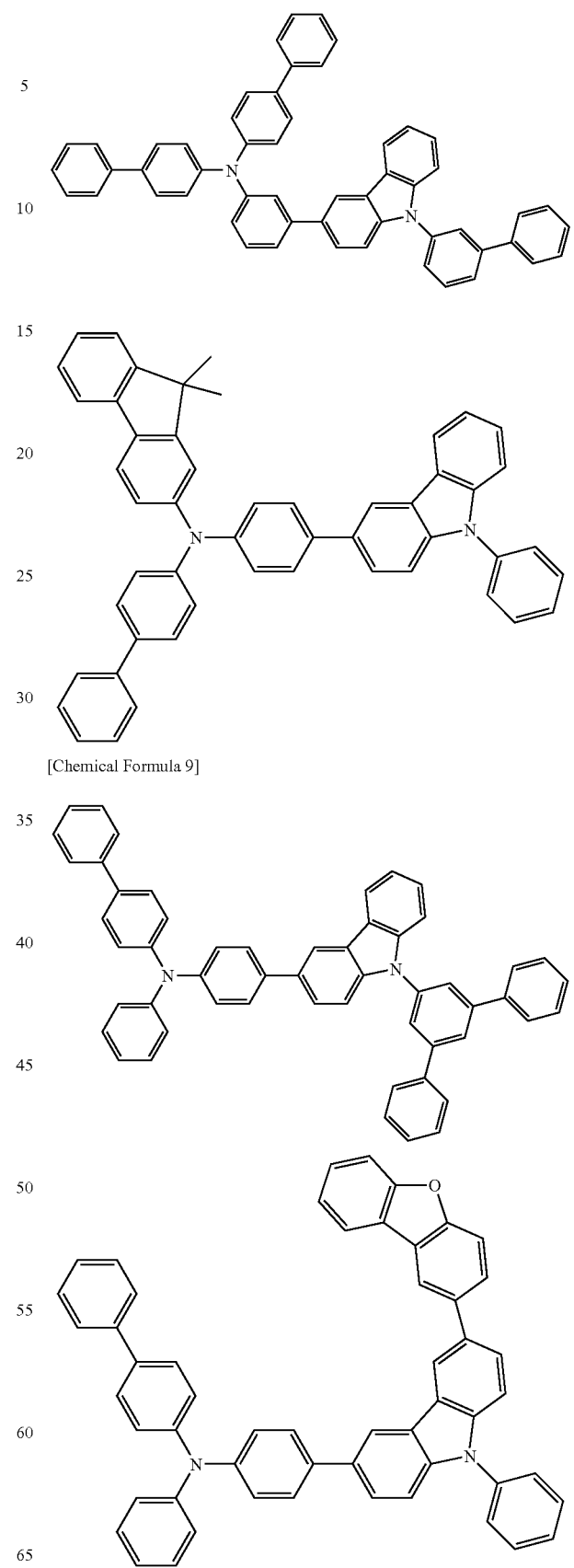
[Chemical Formula 9]

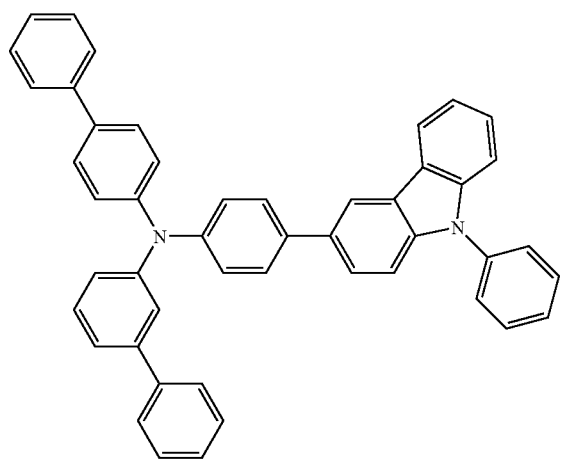
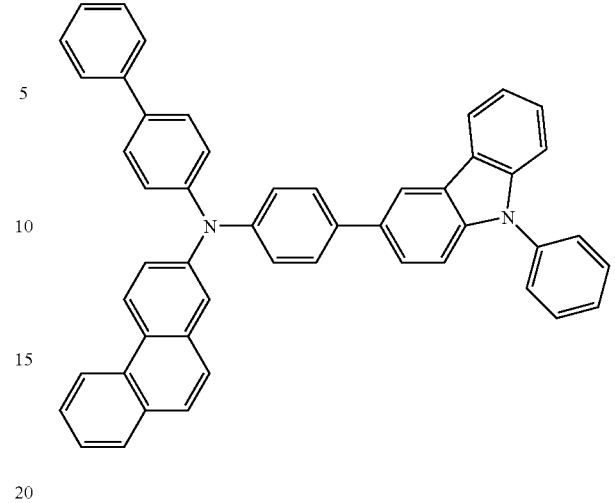
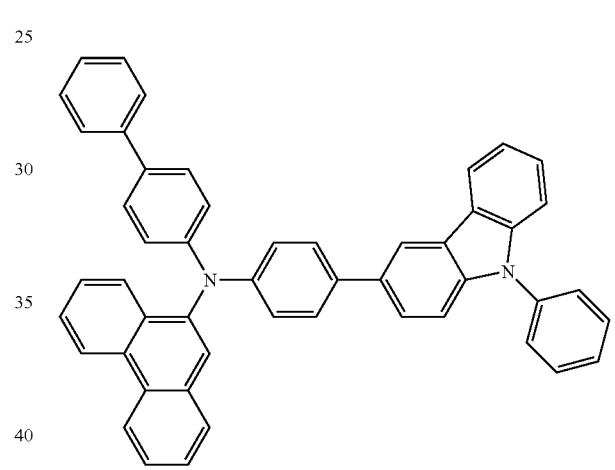
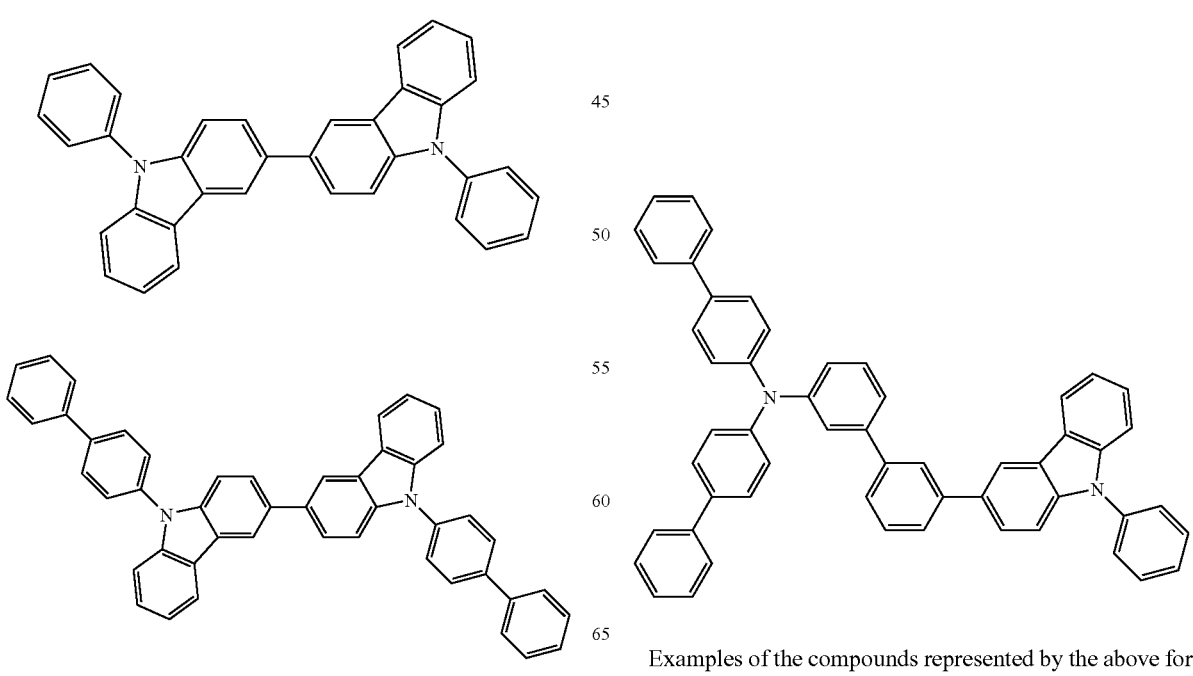
Examples of the compounds represented by the above formula (3) are as follows.

[Chemical Formula 10]
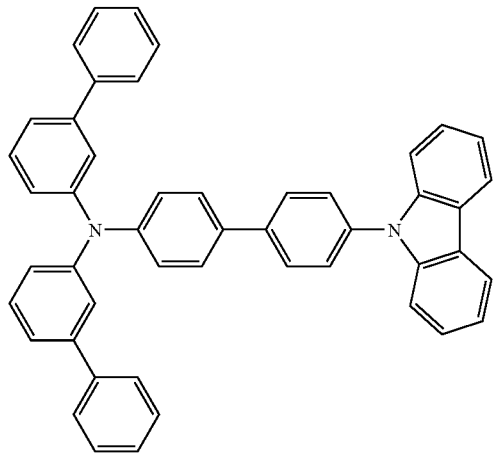
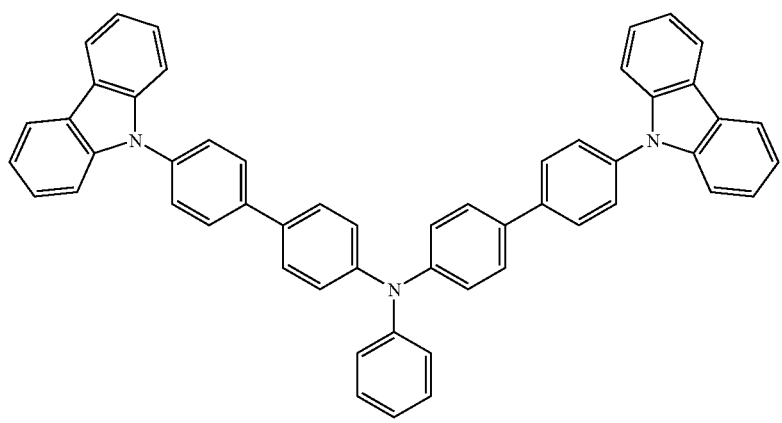
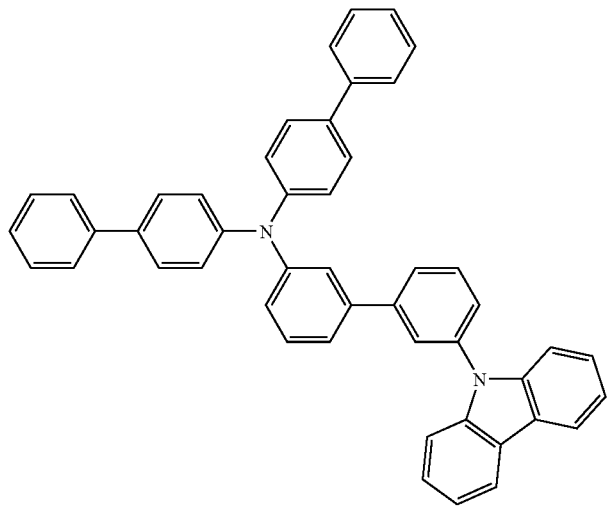

-continued
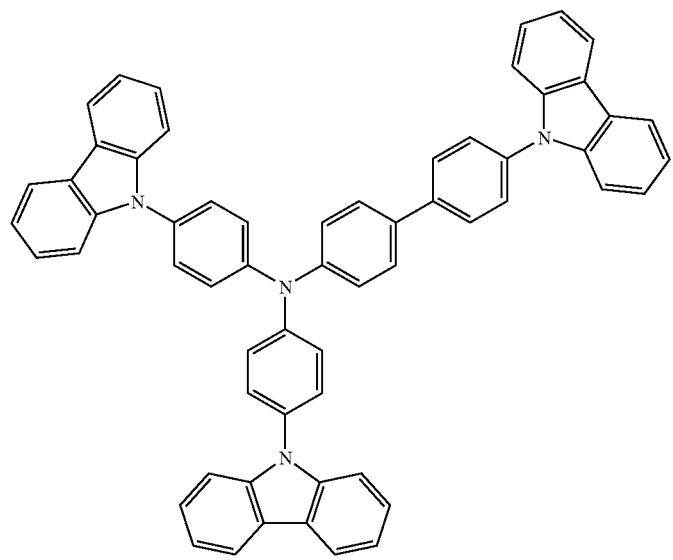
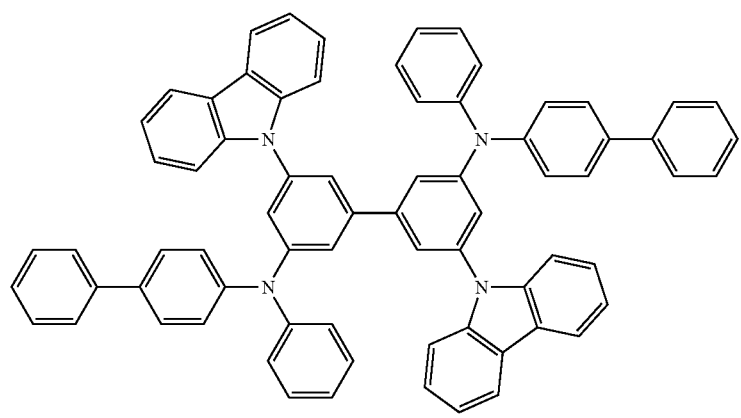
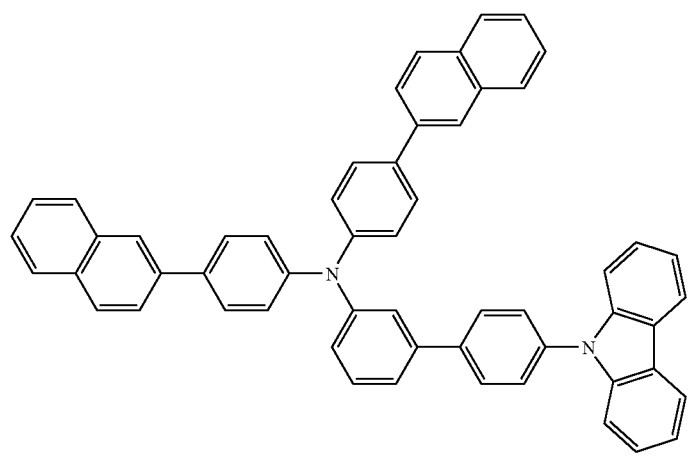

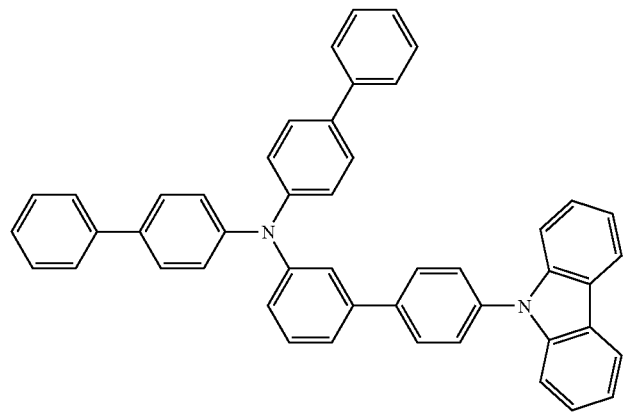
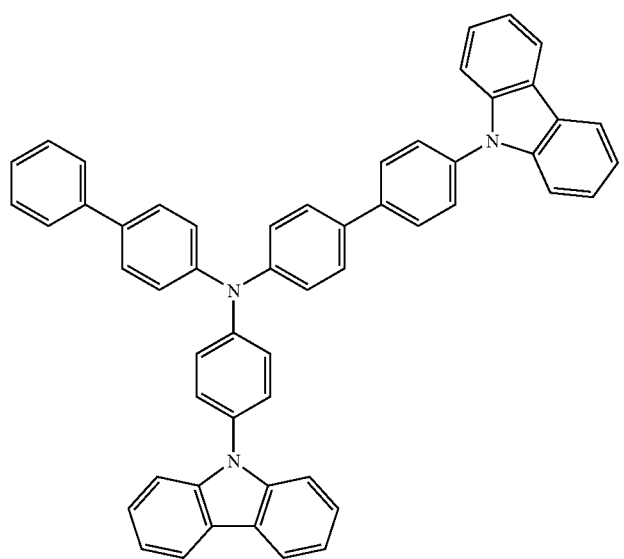
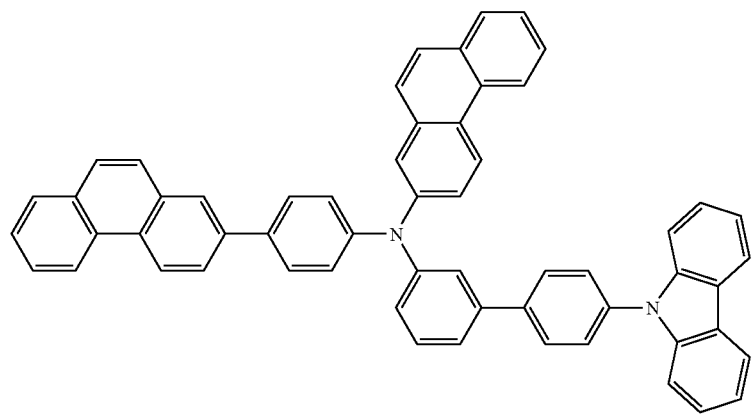

Examples of the compounds represented by the above formula (4) are as follows.
[Chemical Formula 11]
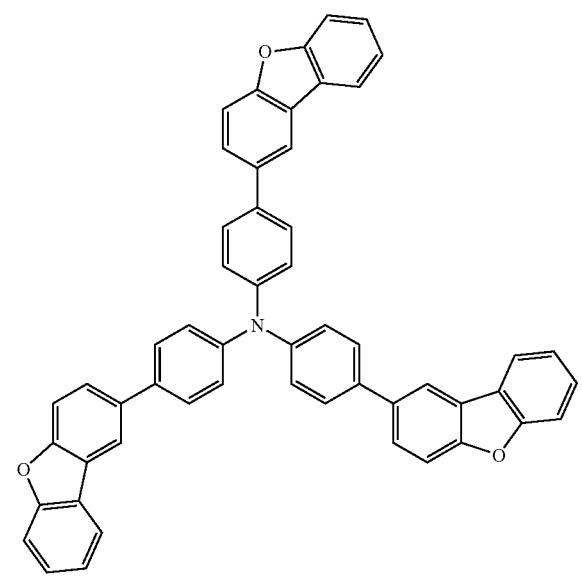
-continued
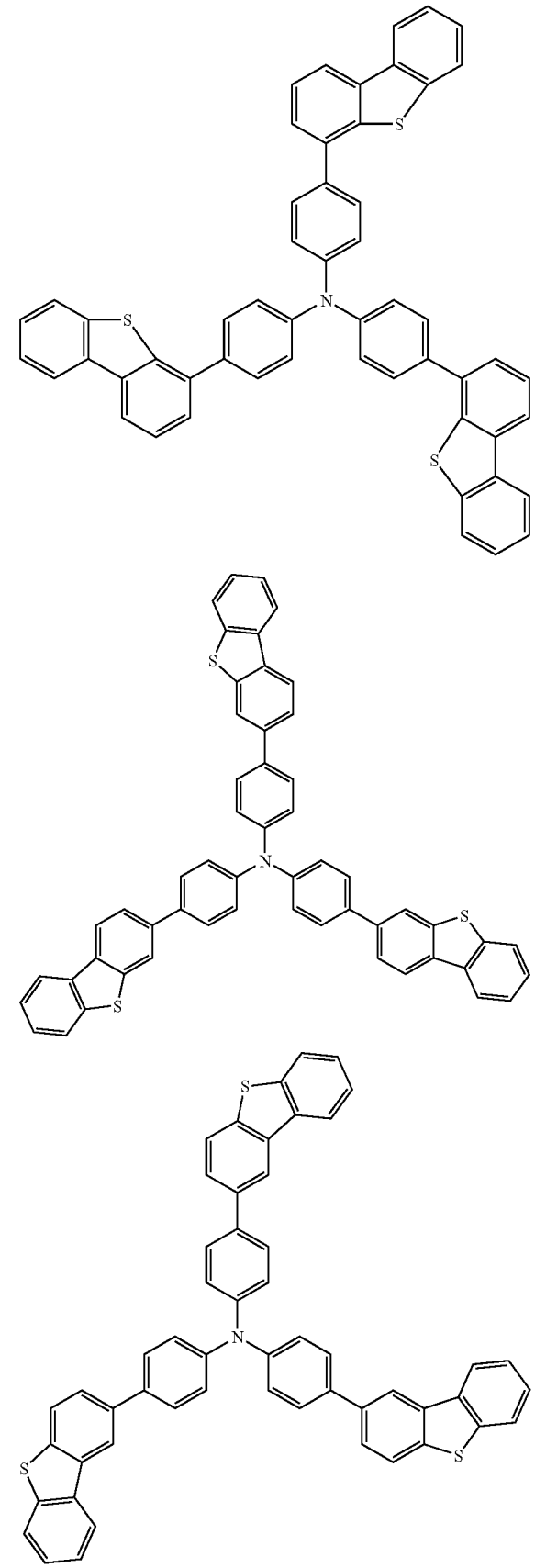

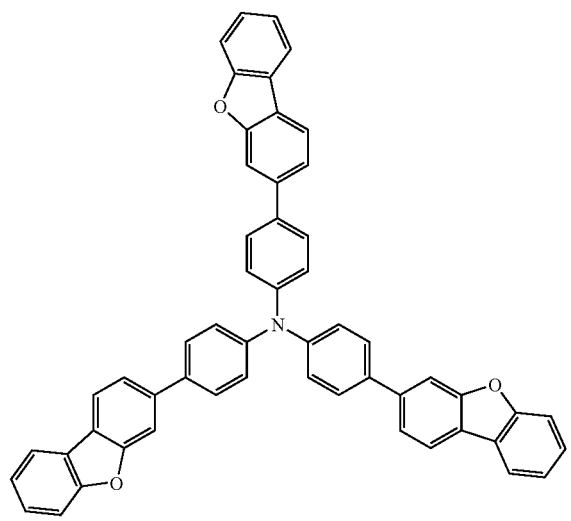
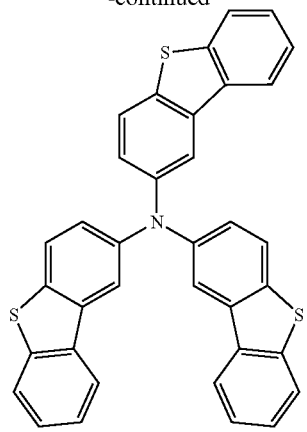
[Chemical Formula 12]
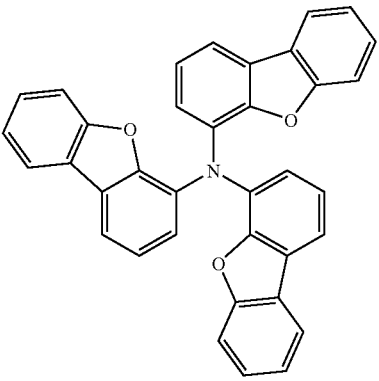
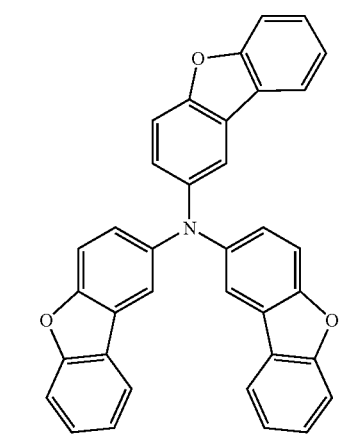

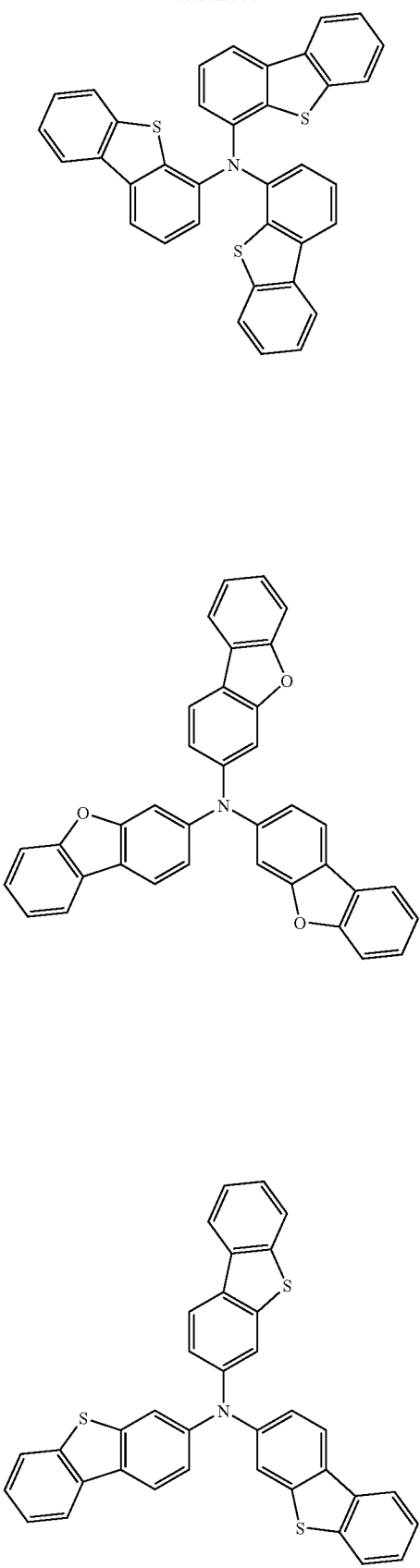
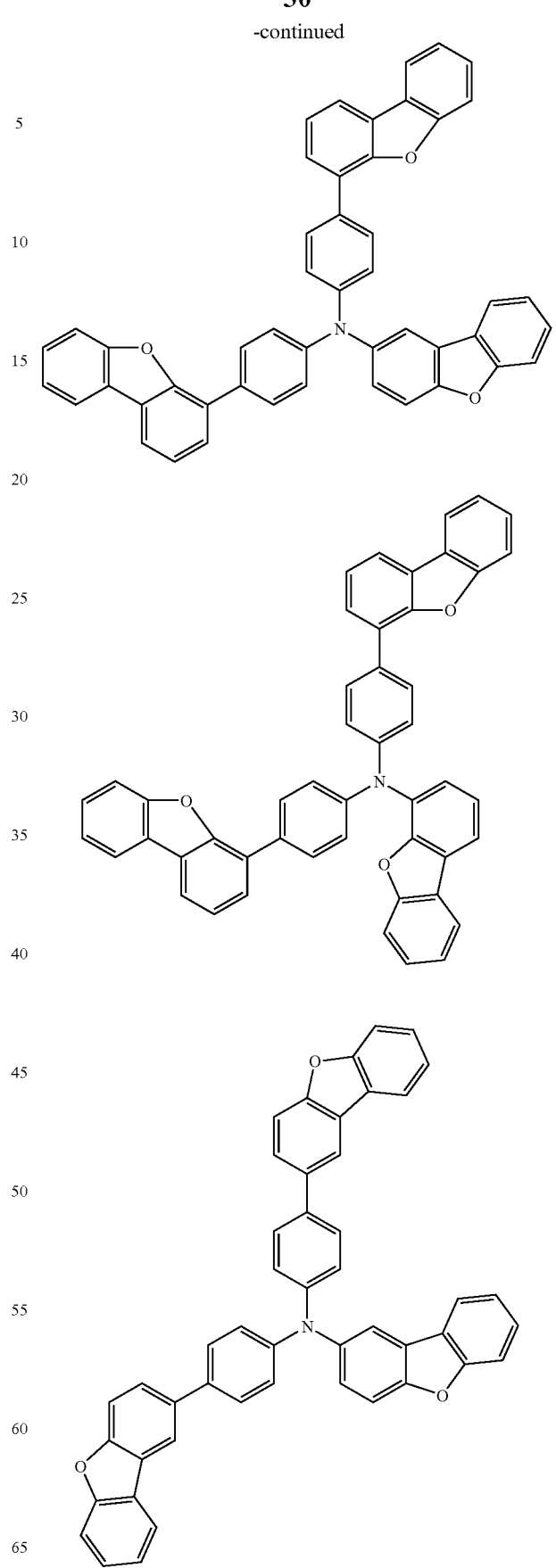

Examples of the compounds represented by the above formula (5) are as follows.
[Chemical Formula 13]
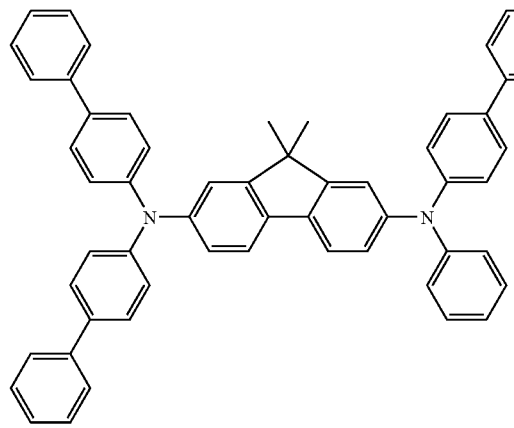
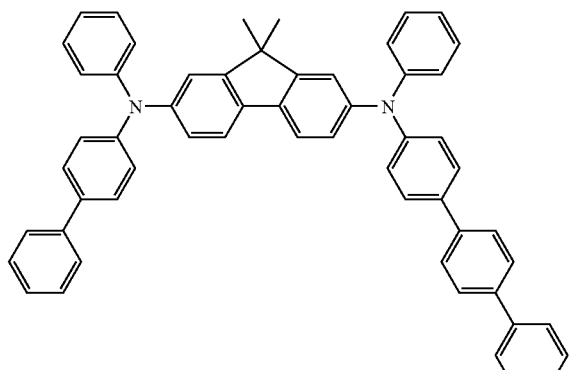
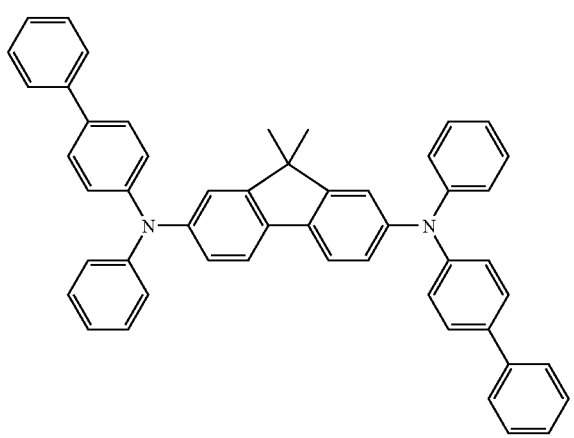
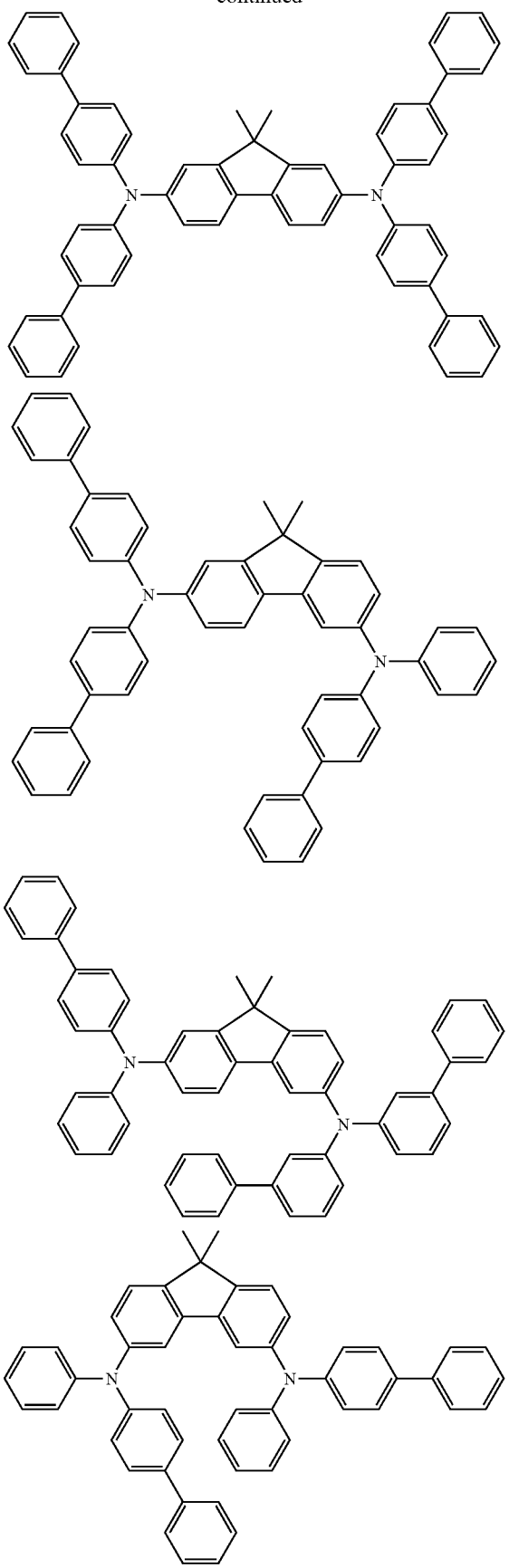

33
-continued
34
-continued
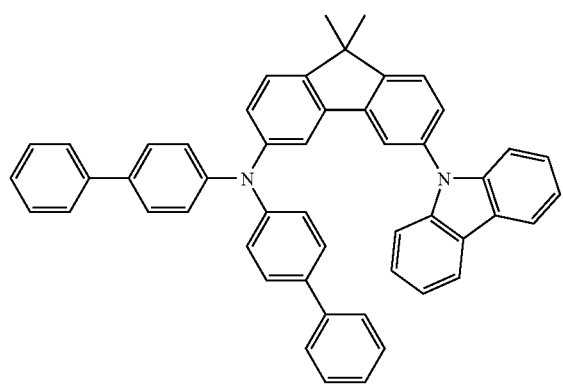
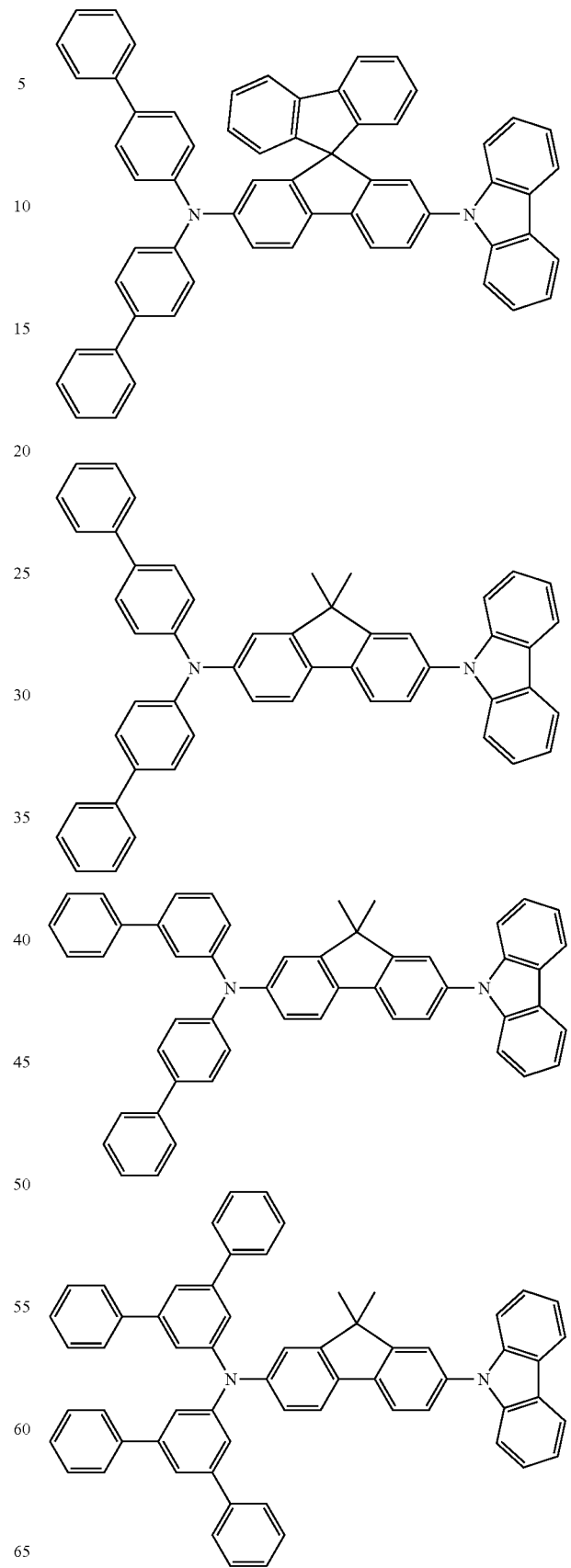
[Chemical Formula 14]

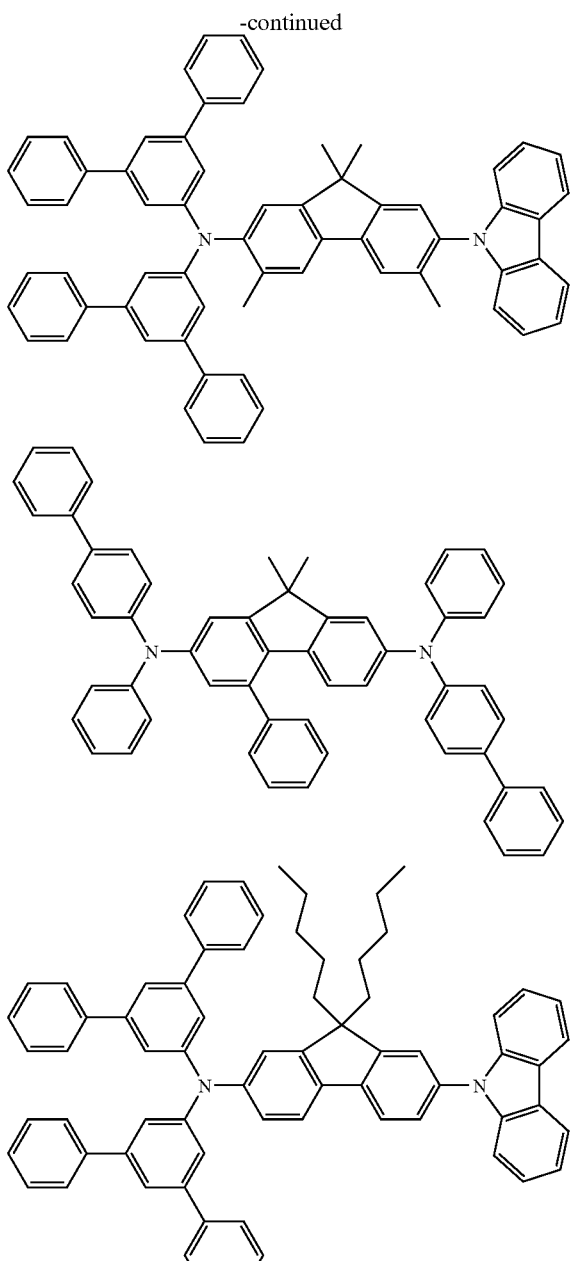

In the above formula (3), $Ar_8$ and $Ar_9$ preferably are not in a form of a ring structure.

When $Ar_8$ and $Ar_9$ form the ring structures, hole injecting capability is unfavorably decreased.

The compounds represented by the above formula (1) contained in the first hole transporting layer is not limited to a single type of compound. In other words, the hole transporting layer may contain a plurality of the compounds represented by the formula (1).

In the aspect of the invention, the hole transporting layer is provided with, sequentially layered on the anode, the first transporting layer formed of the compounds represented by the above formula (1) and the second transporting layer selected from the compounds represented by the above formulae (2) to (5), but another hole transporting layer may be disposed between the anode and the emitting layer.

In the aspect of the invention, the first hole transporting layer may contain other materials. However, when other materials are contained, such materials may interact with each other to exhibit ineffectiveness, e.g., one material absorbs emission from another material to reduce luminous efficiency. Accordingly, other materials are preferably not contained.

In the aspect of the present invention, the hole transporting layer is preferably bonded to the emitting layer.

The compounds represented by the above formula (2) contained in the second hole transporting layer are not limited to a single type of compound. In other words, the second hole transporting layer may contain a plurality of the compounds represented by the formulae (2) to (5).

In the aspect of the invention, the phosphorescent material is preferably a metal complex compound containing a metal selected from the group consisting of Ir, Pt, Os, Cu, Ru, Re and Au.

When such a metal complex compound is used as the phosphorescent material, a quantum yield of phosphorescent emission is high and external quantum efficiency of the emitting device is further improvable.

Particularly, the metal complex compound is preferably an iridium complex, an osmium complex and a platinum complex, more preferably, iridium complex and the platinum complex, most preferably, an ortho-metalated iridium complex.

In the aspect of the invention, the phosphorescent material has an ortho-metal bond of a center metal atom and a carbon atom contained in a ligand.

With this arrangement, a quantum yield of phosphorescent emission is further improvable.

A preferable example of the ortho-metalated metal complex is the iridium complex as shown below.

[Chemical Formula 15]

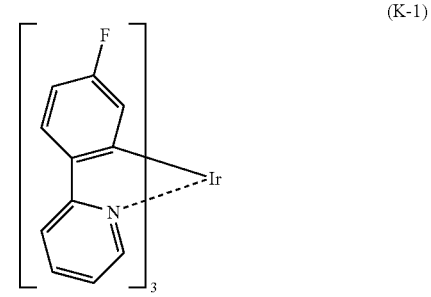

(K-1)

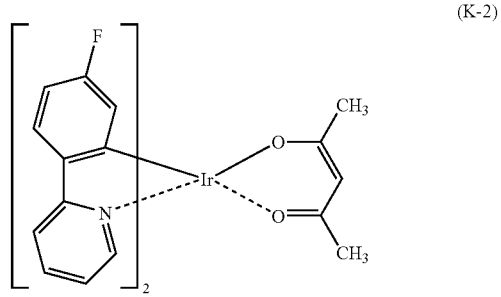

(K-2)

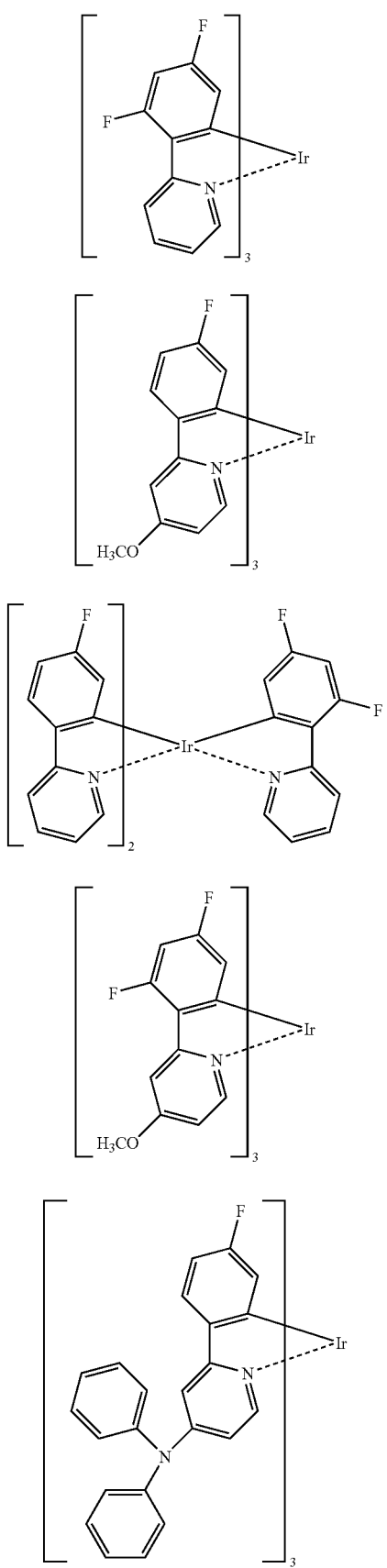
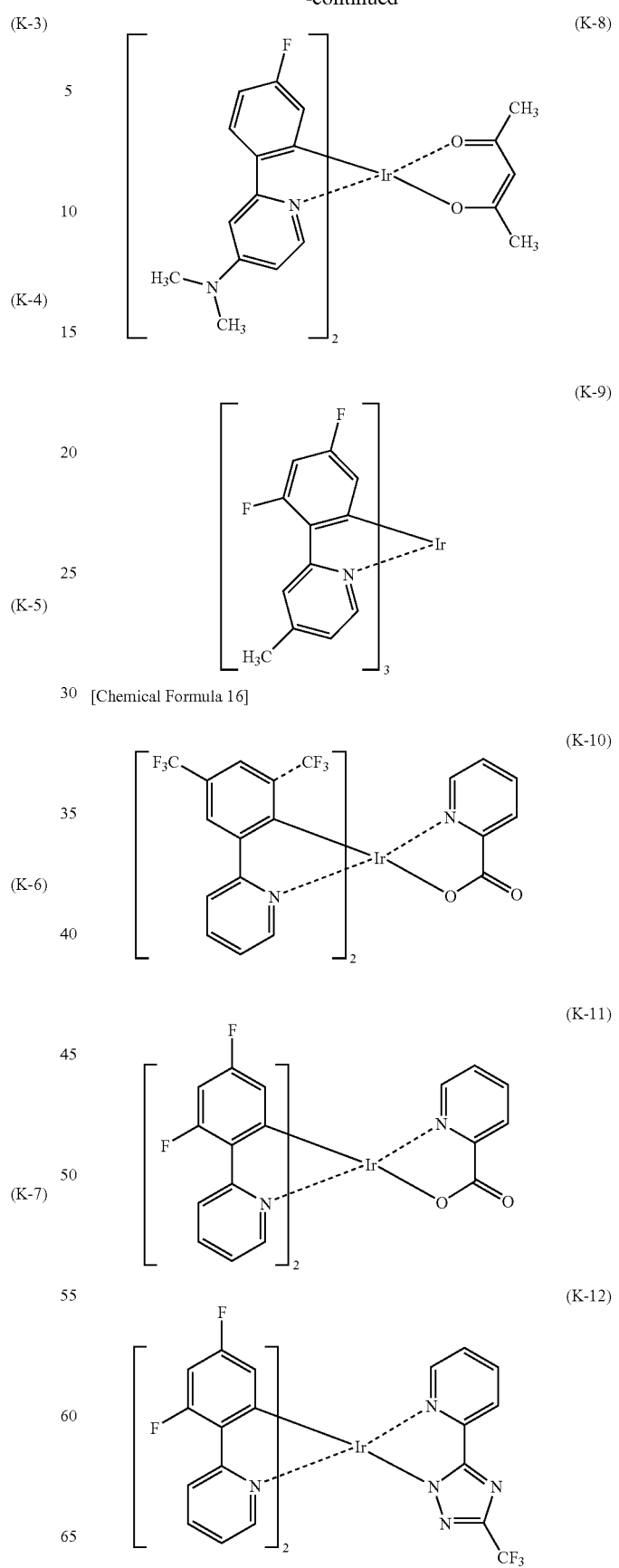

-continued

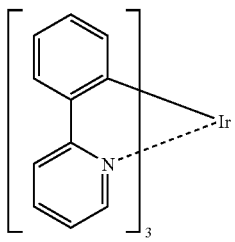
(K-13)

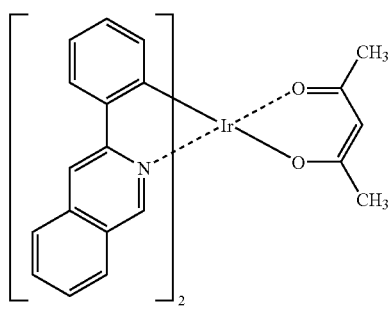
(K-14)

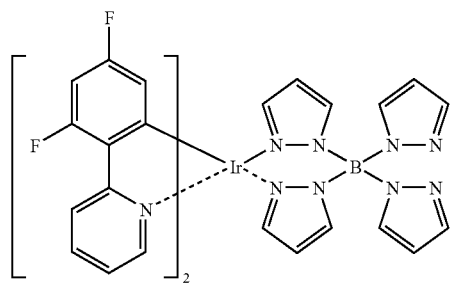
(K-15)

[Chemical Formula 17]

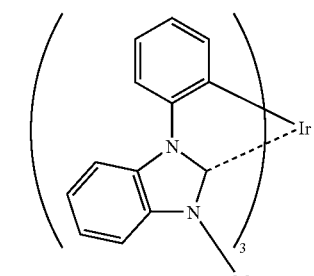
(K-16)

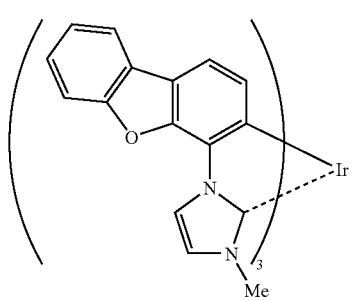
(K-17)

-continued

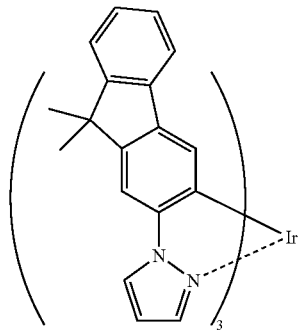
(K-18)

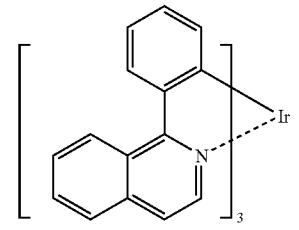
(K-19)

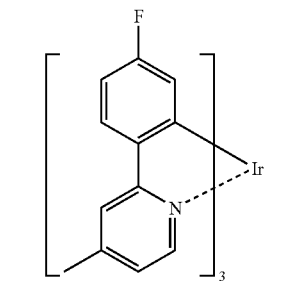
(K-20)

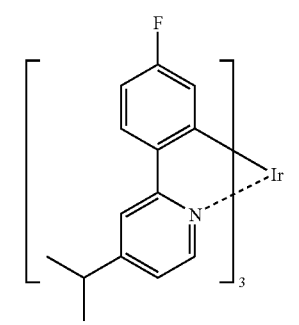
(K-21)

In the aspect of the invention, an excited triplet energy of the host material is in a range of 2.0 eV to 3.2 eV.

With this arrangement, energy can be effectively transferred to the phosphorescent material.

The excited triplet energy gap Eg(T) can be defined as follows based on, for example, phosphorescent spectrum.

Specifically, the materials to be measured each are dissolved in an EPA solvent (diethylether: isopentane:ethanol=5:5:2 in volume ratio) with a concentration of 10 μmol/L, thereby forming a sample for phosphorescence measurement.

Then, the sample for phosphorescence measurement is put into a quartz cell, cooled to 77K and irradiated with exciting light, so that a wavelength of phosphorescence radiated therefrom is measured.

A tangent line is drawn to be tangent to a rising section adjacent to a short-wavelength of the obtained phosphorescence spectrum, a wavelength value at an intersection of the tangent line and a base line is converted into energy value, and the converted energy value is defined as the excited triplet energy gap Eg(T).

For the measurement, a commercially-available measuring equipment F-4500 (manufactured by Hitachi, Ltd.) can be used.

In the aspect of the invention, the host material has a partial molecular structure represented by a formula (6) below.

[Chemical Formula 18]

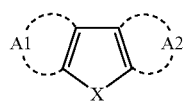
(6)

In the formula (6), A1 or A2 represents a substituted or unsubstituted aromatic heterocyclic ring or an aromatic hydrocarbon ring. X represents a nitrogen atom, an oxygen atom or a sulfur atom.

In the aspect of the invention, the partial molecular structure represented by the formula (6) is one or more selected from formulae (7) to (24) below.

[Chemical Formula 19]

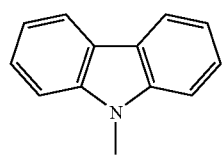
(7)

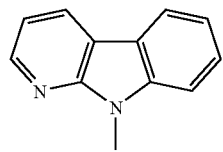
(8)

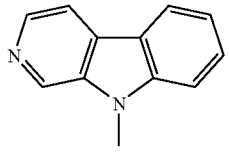
(9)

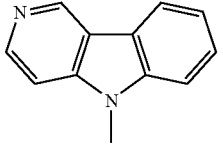
(10)

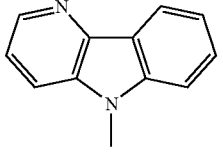
(11)

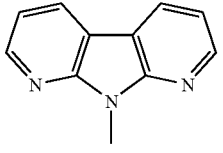
(12)

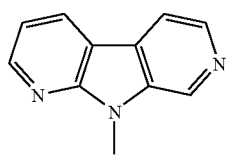
(13)

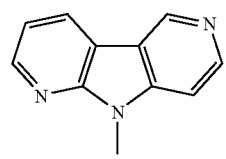
(14)

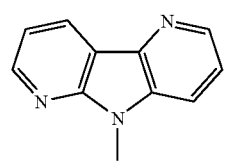
(15)

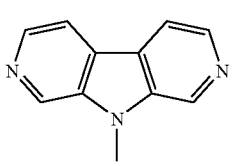
(16)

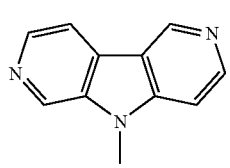
(17)

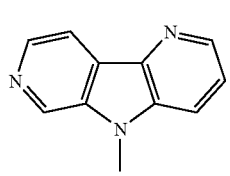
(18)

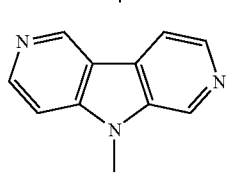
(19)

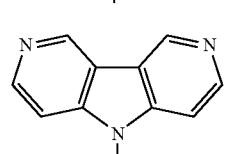
(20)

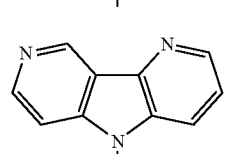
(21)

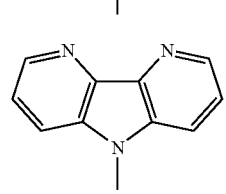
(22)

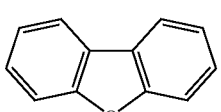

(23)

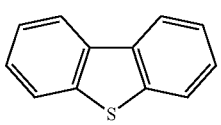

(24)

In the aspect of the invention, a reductive dopant is present at an interfacial region between the cathode and the organic thin-film layer.

The reductive dopant may be at least one compound selected from the group of an alkali metal, an alkali metal complex, an alkali metal compound, an alkali earth metal, an alkali earth metal complex, an alkali earth metal compound, a rare-earth metal, a rare-earth metal complex, a rare-earth metal compound and the like.

Examples of the alkali metal are Na (work function: 2.36 eV), K (work function: 2.28 eV), Rb (work function: 2.16 eV) and Cs (work function: 1.95 eV), which particularly preferably has a work function of 2.9 eV or less. Among the above, the reductive dopant is preferably K, Rb or Cs, more preferably Rb or Cs, the most preferably Cs.

Examples of the alkali earth metal are Ca (work function: 2.9 eV), Sr (work function: 2.0 to 2.5 eV) and Ba (work function: 2.52 eV), which particularly preferably has a work function of 2.9 eV or less.

Examples of the rare-earth metal are Sc, Y, Ce, Tb, Yb and the like, which particularly preferably has a work function of 2.9 eV or less.

These metals possess especially high reducing property, so that doping to an electron injecting region in a relatively small amount can improve luminance of and extend a lifetime of an organic EL device.

Examples of the alkali metal compound are an alkali oxide such as $Li_2O$, $Cs_2O$ or $K_2O$, an alkali halogen compound such as LiF, NaF, CsF or KF, among which $Li_2O$ (the alkali oxide), LiF and NaF (the alkali fluoride) are preferable.

Examples of the alkali earth metal compound are BaO, SrO, CaO and a mixture thereof, i.e., $Ba_xSr_{1-x}O$ ($0<x<1$), $Ba_xCa_{1-x}O$ ($0<x<1$), among which BaO, SrO and CaO are preferable.

Examples of the rare-earth metal compound are $YbF_3$, $ScF_3$, $ScO_3$, $Y_2O_3$, $Ce_2O_3$, $GdF_3$ and $TbF_3$, among which $YbF_3$, $ScF_3$ and $TbF_3$ are preferable.

The alkali metal complex, the alkali earth metal complex and the rare-earth metal complex are not specifically limited, as long as at least one of alkali metal ion, alkali earth metal ion and rare-earth metal ion is contained therein as metal ion. A ligand for each of the complexes is preferably quinolinol, benzoquinolinol, acridinol, phenanthridinol, hydroxyphenyl oxazole, hydroxyphenyl thiazole, hydroxydiaryl oxadiazole, hydroxydiaryl thiadiazole, hydroxyphenyl pyridine, hydroxyphenyl benzoimidazole, hydroxybenzo triazole, hydroxy fluborane, bipyridyl, phenanthroline, phthalocyanine, porphyrin, cyclopentadiene, β-diketones, azomethines, or a derivative thereof, but the ligand is not limited thereto.

The reductive dopant is added to preferably form a layer or an island pattern in the interfacial region. The layer of the reductive dopant or the island pattern of the reductive dopant is preferably formed by depositing the reductive dopant by resistance heating deposition while an emitting material for forming the interfacial region or an organic substance as an electron-injecting material are simultaneously deposited, so that the reductive dopant is dispersed in the organic substance. Dispersion concentration at which the reductive dopant is dispersed in the organic substance is a mole ratio (organic substance to reductive dopant) of 100:1 to 1:100, preferably 5:1 to 1:5.

When the reductive dopant forms the layer, the emitting material or the electron injecting material for forming the organic layer of the interfacial region is initially layered, and the reductive dopant is subsequently deposited singularly thereon by resistance heating deposition to form a preferably 0.1 to 15 nm-thick layer.

When the reductive dopant forms an island pattern, the emitting material or the electron injecting material for forming the organic layer of the interfacial region is initially formed in the island shape, and the reductive dopant is subsequently deposited singularly thereon by resistance heating deposition to form a preferably 0.05 to 1 nm-thick island shape.

A ratio of the main component to the reductive dopant in the organic EL device of the invention is preferably a mole ratio (main component to reductive dopant) of 5:1 to 1:5, more preferably 2:1 to 1:2.

In the aspect of the invention, preferably, an electron injecting layer is interposed between the emitting layer and the cathode, and contains a nitrogen-containing cyclic derivative as a main component.

It should be noted that "as the main component" means that the nitrogen-containing cyclic derivative is contained in the electron injecting layer with a content of 50 mass % or more.

A preferable example of an electron transporting material for forming the electron injecting layer is an aromatic heterocyclic compound having one or more heteroatoms in a molecule, among which a nitrogen-containing cyclic derivative is particularly preferable.

The nitrogen-containing cyclic derivative is preferably represented by a formula (A) below.

[Chemical Formula 20]

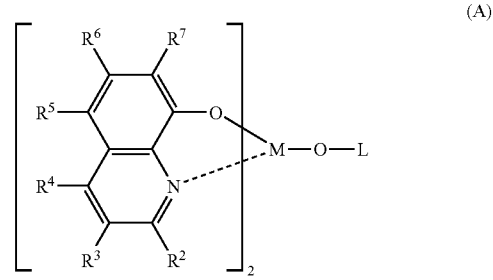

(A)

In the formula (A), $R^2$ to $R^7$ each independently represent a hydrogen atom, a halogen atom, an oxy group, an amino group or a hydrocarbon group having 1 to 40 carbon atoms. $R^2$ to $R^7$ may be substituted or unsubstituted.

Examples of the halogen atom include fluorine and chlorine. Examples of the substituted or unsubstituted amino group are an alkylamino group, an arylamino group, an aralkylamino group and the same as those described in relation to the above-mentioned amino group.

Examples of the hydrocarbon group having 1 to 40 carbon atoms are a substituted or unsubstituted alkyl group, alkenyl group, cycloalkyl group, alkoxy group, aryl group, heterocyclic group, aralkyl group, aryloxy group and alkoxycarbonyl group. Examples of the alkyl group, alkenyl group, cycloalkyl group, alkoxy group, aryl group, heterocyclic group, aralkyl group and aryloxy group are the same as above. The alkoxycarbonyl group is represented by —COOY', where examples of Y' are the same as those in relation to the above-mentioned alkyl group.

M represents aluminum (Al), gallium (Ga) or indium (In), among which aluminum (Al) is preferable.

L in the formula (A) represents a group represented by a formula (A') or (A") below.

[Chemical Formula 21]

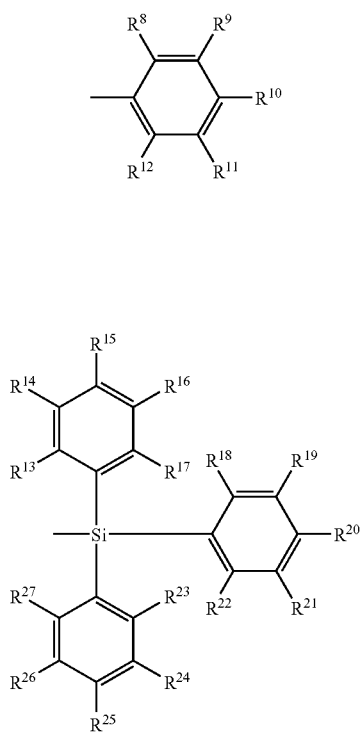

In the formula (A'), $R^8$ to $R^{12}$ each independently represent a hydrogen atom or a substituted or unsubstituted hydrocarbon group having 1 to 40 carbon atoms. Adjacent groups may form a cyclic structure.

In the formula (A"), $R^{13}$ to $R^{27}$ each independently represent a hydrogen atom or a substituted or unsubstituted hydrocarbon group having 1 to 40 carbon atoms. Adjacent groups may form a cyclic structure.

Examples of the hydrocarbon group having 1 to 40 carbon atoms represented by each of $R^8$ to $R^{12}$ and $R^{13}$ to $R^{27}$ in the formulae (A') and (A") are the same as those of $R^2$ to $R^7$.

Examples of the divalent group formed when an adjacent set of groups $R^8$ to $R^{12}$ and $R^{13}$ to $R^{27}$ forms a cyclic structure are a tetramethylene group, a pentamethylene group, a hexamethylene group, a diphenylmethane-2,2'-diyl group, a diphenylethane-3,3'-diyl group and a diphenylpropane-4,4'-diyl group.

Examples of the nitrogen-containing cyclic metal chelate complex represented by the formula (A) will be shown below. However, the nitrogen-containing cyclic metal chelate complex is not limited to the exemplary compounds shown below.

[Chemical Formula 22]

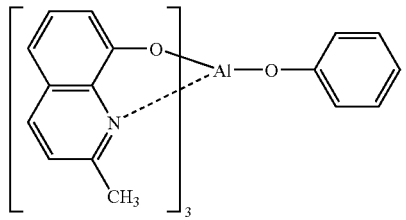
(A-1)

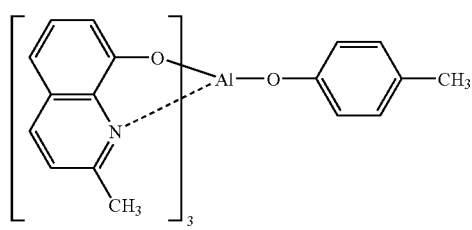
(A-2)

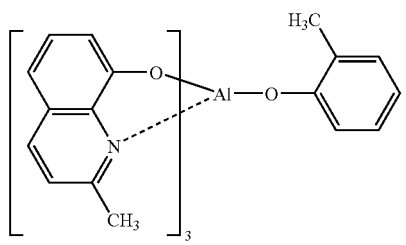
(A-3)

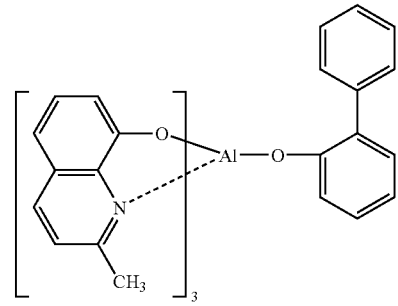
(A-4)

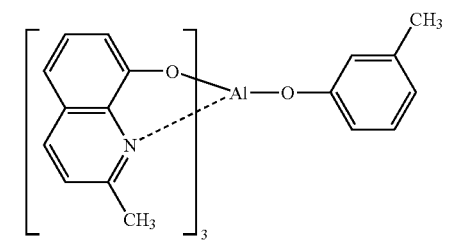
(A-5)

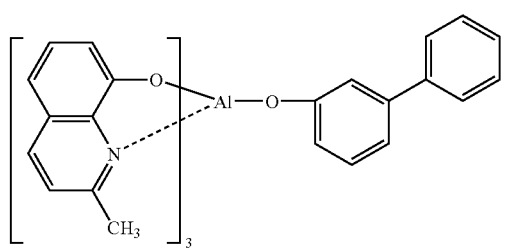
(A-6)

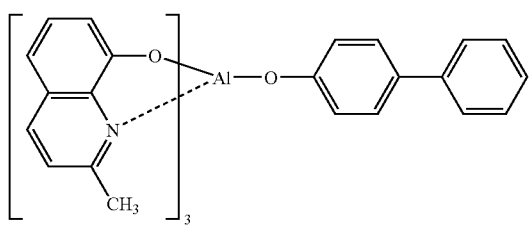
(A-7)
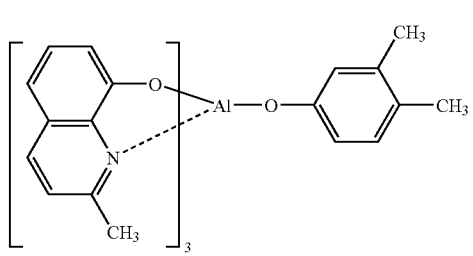
(A-8)
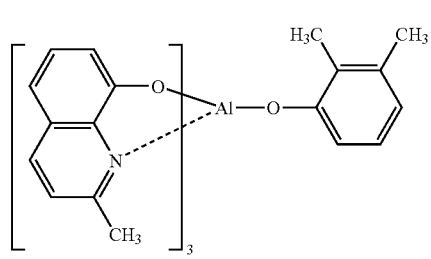
(A-9)
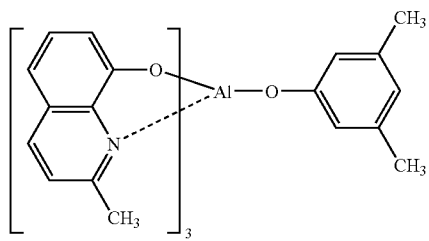
(A-10)
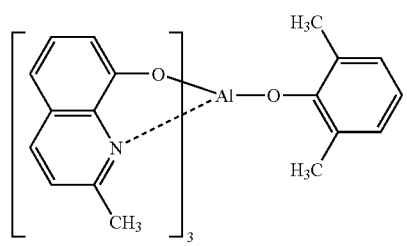
(A-11)
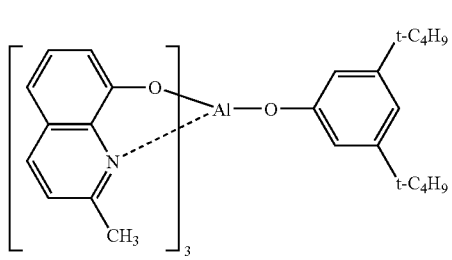
(A-12)
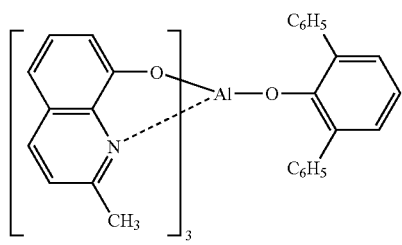
(A-13)
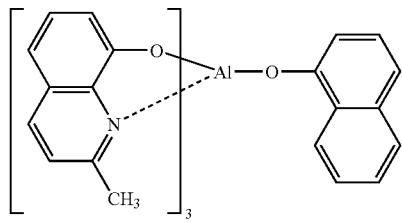
(A-14)
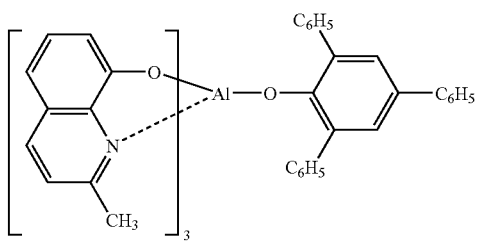
(A-15)
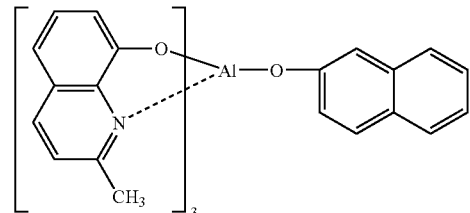
(A-16)
[Chemical Formula 23]
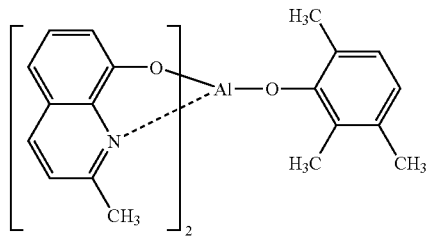
(A-17)
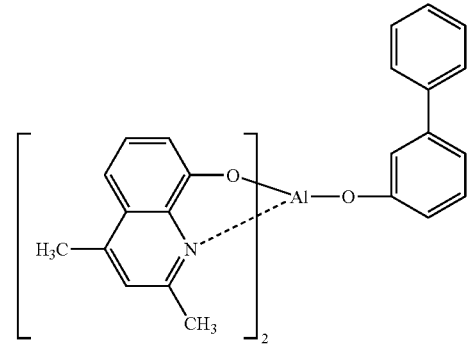
(A-18)

(A-19)
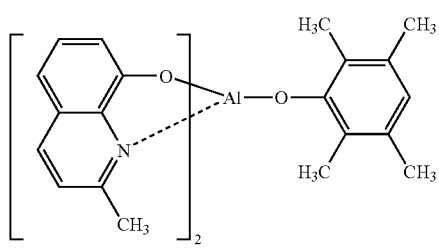
(A-20)
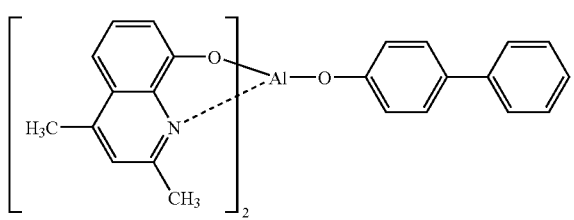
(A-21)
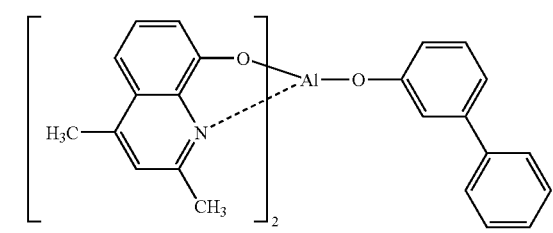
(A-22)
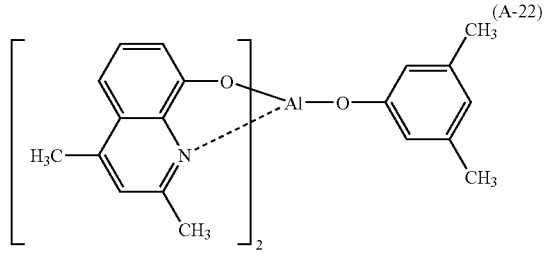
(A-23)
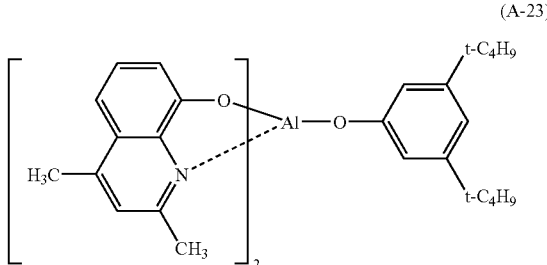
(A-24)
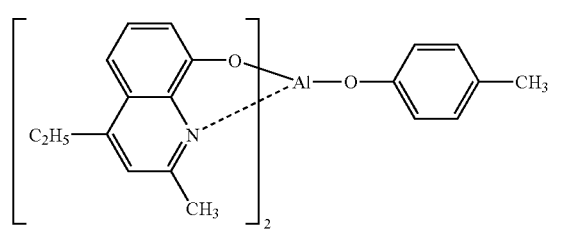
(A-26)
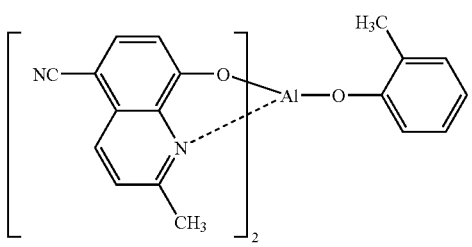
(A-27)
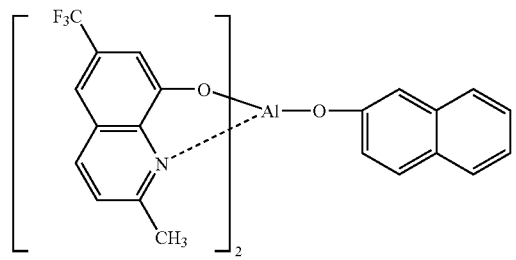
(A-28)
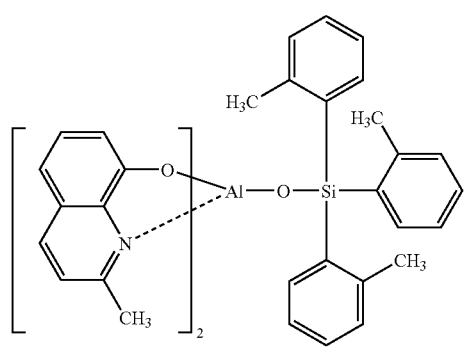
(A-29)
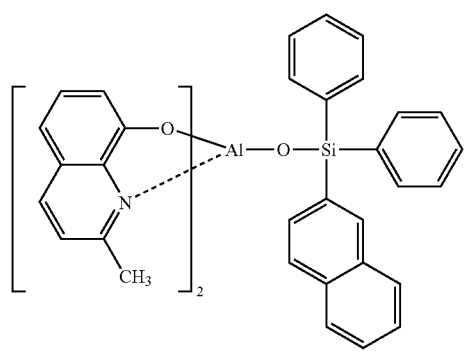
(A-30)
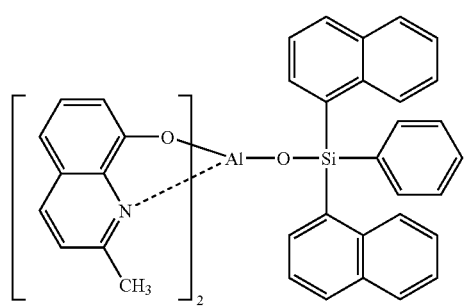

[Chemical Formula 24]

(A-31)
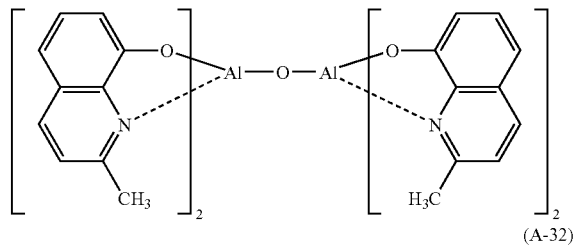

(A-32)

(A-33)
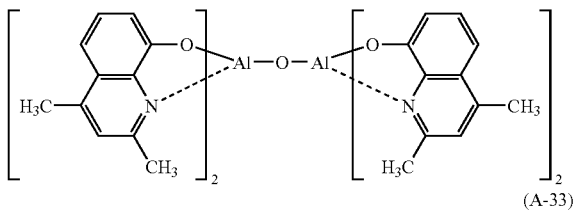

(A-34)
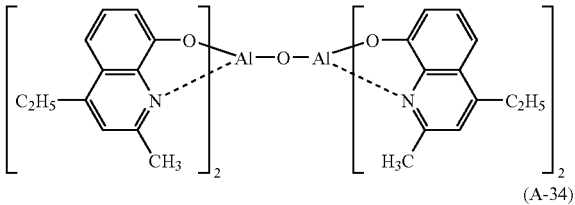

(A-35)
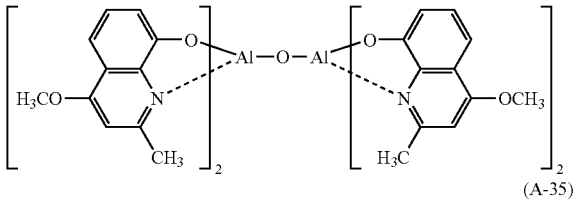

(A-36)
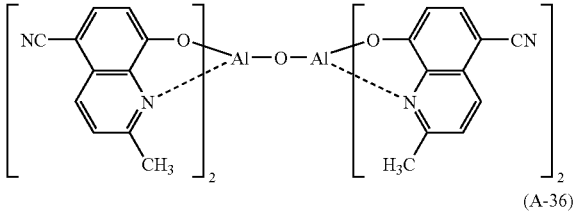

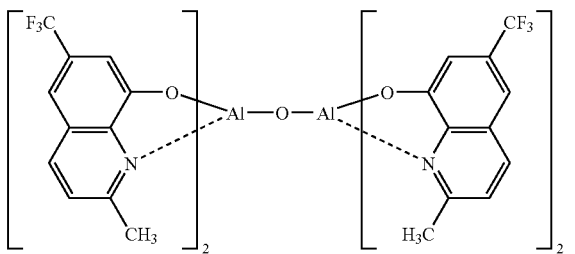

A preferable example of the nitrogen-containing cyclic derivative as the main component of the electron injecting layer also includes a nitrogen-containing 5-membered ring derivative. Examples of a nitrogen-containing 5-membered ring are an imidazoles ring, a triazoles ring, a tetrazole ring, an oxadiazole ring, a thiadiazole ring, an oxatriazole ring and a thiatriazole ring. Examples of the nitrogen-containing 5-membered ring derivative are a benzoimidazole ring, a benzotriazole ring, a pyridinoimidazole ring, a pyrimidinoimidazole ring and a pyridazinoimidazole ring, among which a compound represented by a formula (B) below is particularly preferable.

[Chemical Formula 25]

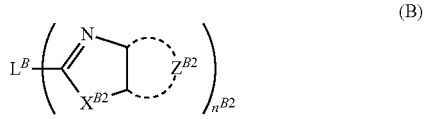
(B)

In the formula (B), $L^B$ represents a divalent or more linking group, examples of which are carbon, silicon, nitrogen, boron, oxygen, sulfur, metal (e.g. barium and beryllium), an aryl group and an aromatic heterocyclic group. Among those, carbon, nitrogen, silicon, boron, oxygen, sulfur, the aryl group and the aromatic heterocyclic group are preferable, and carbon, silicon, the aryl group and the aromatic heterocyclic group are more preferable.

The aryl group and aromatic heterocyclic group of $L^B$ may be substituted or unsubstituted. Examples of the substituent are preferably an alkyl group, an alkenyl group, an alkynyl group, an aryl group, an amino group, an alkoxy group, an aryloxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a sulfonyl group, a halogen atom, a cyano group and an aromatic heterocyclic group, more preferably an alkyl group, an aryl group, an alkoxy group, aryloxy group, halogen, a cyano group and an aromatic heterocyclic group, further preferably an alkyl group, an aryl group, alkoxy group, an aryloxy group and an aromatic heterocyclic group, particularly preferably an alkyl group, an aryl group an alkoxy group and an aromatic heterocyclic group.

Specifically, example's for $L^B$ are as follows.

[Chemical Formula 26]

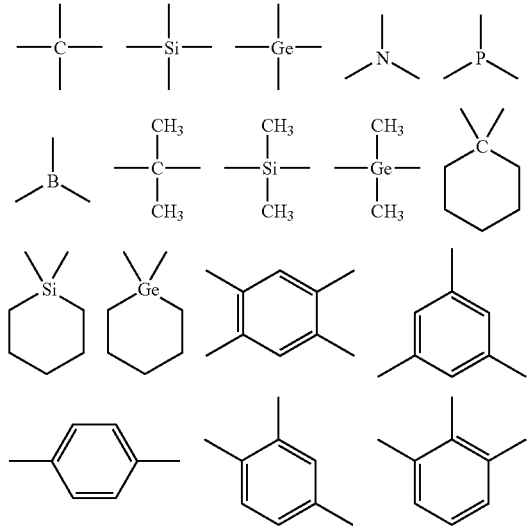

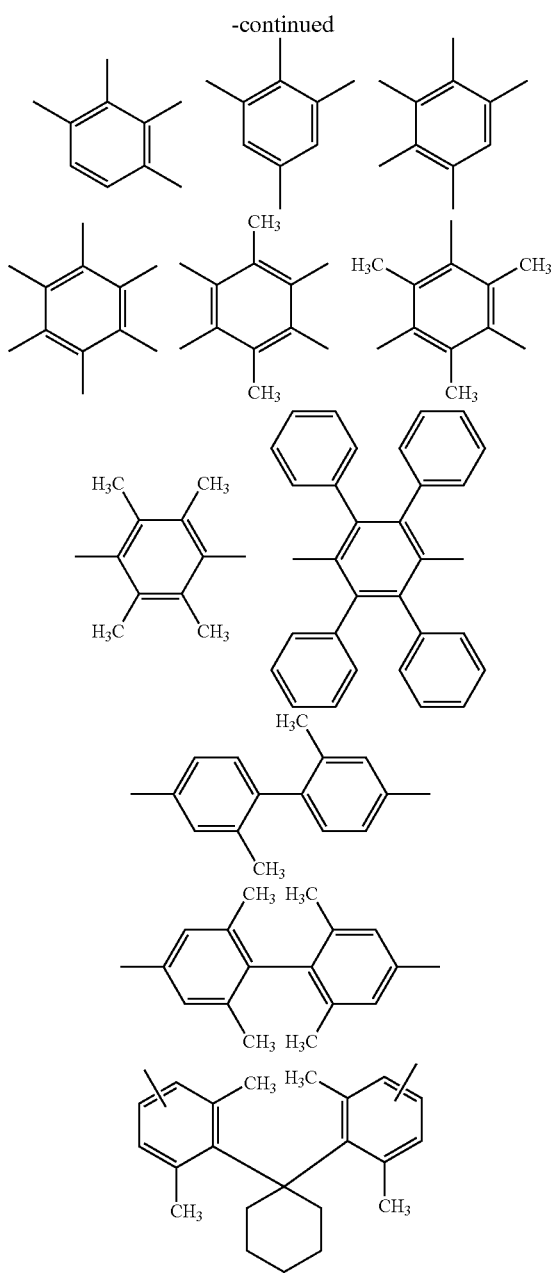

In the formula (B), $X^{B2}$ represents —O—, —S— or =N—$R^{B2}$. $R^{B2}$ represents hydrogen, an aliphatic hydrocarbon group, an aryl group or heterocyclic group.

The aliphatic hydrocarbon group for $R^{B2}$ is a linear, branched or cyclic alkyl group, alkenyl group and alkynyl group, among which the alkyl group is preferable. The alkyl group preferably has 1 to 20 carbon atoms, more preferably 1 to 12 carbon atoms, particularly preferably 1 to 8 carbon atoms and is exemplified by methyl, ethyl, isopropyl, t-butyl, n-octyl, n-decyl, n-hexadecyl, cyclopropyl, cyclopentyl, cyclohexyl and the like. The alkenyl group preferably has 2 to 20 carbon atoms, more preferably 2 to 12 carbon atoms, particularly preferably 2 to 8 carbon atoms and is exemplified by vinyl, allyl, 2-butenyl, 3-pentenyl and the like. The alkynyl group preferably has 2 to 20 carbon atoms, more preferably 2 to 12 carbon atoms, particularly preferably 2 to 8 carbon atoms and is exemplified by propargyl and 3-pentynyl.

The aryl group for $R^{B2}$, which may be monocyclic or condensed, preferably has 6 to 30 carbon atoms, more preferably 6 to 20 carbon atoms, further preferably 6 to 12 carbon atoms. Examples of the aryl group are phenyl, 2-methylphenyl, 3-methylphenyl, 4-methylphenyl, 2-methoxyphenyl, 3-trifluoromethylphenyl, pentafluorophenyl, 1-naphthyl and 2-naphthyl.

The heterocyclic group, which may be monocyclic or condensed, preferably has 1 to 20 carbon atoms, more preferably 1 to 12 carbon atoms, further preferably 2 to 10 carbon atoms. The heterocyclic group is preferably an aromatic heterocyclic group having at least one of a nitrogen atom, an oxygen atom, a sulfur atom and a selenium atom. Examples of the heterocyclic group are pyrrolidine, piperidine, piperazine, morpholine, thiophene, selenophene, furan, pyrrole, imidazole, pyrazole, pyridine, pyrazine, pyridazine, pyrimidine, triazole, triazine, indole, indazole, purine, thiazoline, thiazole, thiadiazole, oxazoline, oxazole, oxadiazole, quinoline, isoquinoline, phthalazine, naphthyridine, quinoxaline, quinazoline, cinnoline, pteridine, acridine, phenanthroline, phenazine, tetrazole, benzoimidazole, benzooxazole, benzothiazole, benzotriazole, tetra-aza indene, carbazole and azepine, preferably furan, thiophene, pyridine, pyrazine, pyrimidine, pyridazine, triazine, quinoline, phthalazine, naphthyridine, quinoxaline and quinazoline, further preferably furan, thiophene, pyridine and quinoline, further more preferably quinoline.

The aliphatic hydrocarbon group, aryl group and heterocyclic group, which are represented by $R^{B2}$, may be substituted or unsubstituted. Examples of the substituent are the same as those of the group represented by $L^B$ and preferable examples are also the same.

$R^{B2}$ is preferably the aliphatic hydrocarbon group, the aryl group or the heterocyclic group, more preferably the aliphatic hydrocarbon group (which preferably has 6 to 30 carbon atoms, more preferably 6 to 20 carbon atoms, further preferably 6 to 12 carbon atoms) or the aryl group, further preferably the aliphatic hydrocarbon group (which preferably has 1 to 20 carbon atoms, more preferably 1 to 12 carbon atoms, further preferably 2 to 10 carbon atoms).

$X^{B2}$ is preferably —O— or =N—$R^{B2}$, more preferably =N—$R^{B2}$.

$Z^{B2}$ represents a group of atoms necessary for forming an aromatic ring. The aromatic ring to be formed in $Z^{B2}$ may be an aromatic hydrocarbon ring or an aromatic heterocyclic ring. Examples of the aromatic ring are a benzene ring, a pyridine ring, a pyrazine ring, a pyrimidine ring, a pyridazine ring, a triazine ring, a pyrrole ring, a furan ring, a thiophene ring, a selenophene ring, a tellurophene ring, an imidazole ring, a thiazole ring, a selenazole ring, a tellurazole ring, a thiadiazole ring, an oxadiazole ring and a pyrazole ring, preferably a benzene ring, a pyridine ring, a pyrazine ring, a pyrimidine ring and a pyridazine ring, more preferably a benzene ring, a pyridine ring and a pyrazine ring, further preferably a benzene ring and pyridine ring, particularly preferably a pyridine ring.

The aromatic ring to be formed in $Z^{B2}$ may further form a condensed ring with another ring and may be substituted or unsubstituted. Examples of the substituent, which are the same as those of the group represented by $L^B$, are preferably an alkyl group, an alkenyl group, an alkynyl group, an aryl group, an amino group, an alkoxy group, an aryloxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a sulfonyl group, a halogen atom, a cyano group and a heterocyclic group, more preferably an alkyl group, an aryl group, an alkoxy group, an aryloxy group, a halogen atom, a cyano group and a heterocyclic group, further preferably an alkyl group, an aryl group, an alkoxy group, an aryloxy group and an aromatic heterocyclic group, particularly preferably an alkyl group, an aryl group an alkoxy group and an aromatic heterocyclic group.

$N^{B2}$ is an integer in a range of 1 to 4, preferably 2 to 3.

Among the nitrogen-containing 5-membered ring derivatives represented by the formula (B), a compound represented by a formula (B') below is more preferable.

[Chemical Formula 27]

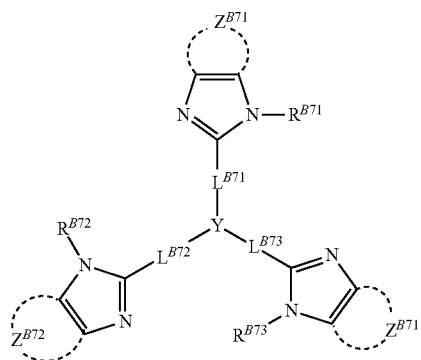

(B')

In the formula (B'), $R^{B71}$, $R^{B72}$ and $R^{B73}$ each are the same as $R^{B2}$ in the formula (B). Preferable range of $R^{B71}$, $R^{B72}$ and $R^{B73}$ each are the same as that of $R^{B2}$.

$Z^{B71}$, $Z^{B72}$ and $Z^{B73}$ each are the same as $Z^{B2}$ in the formula (B). Preferable range of $Z^{B71}$, $Z^{B72}$ and $Z^{B73}$ each are the same as that of $Z^{B2}$.

$L^{B71}$, $L^{B72}$ and $L^{B73}$ each represent a linking group and are exemplified by a divalent linking group among the examples of $L^B$ in the formula (B). The linking group is preferably in a combination of a single bond, a divalent aromatic hydrocarbon ring group, a divalent aromatic heterocyclic group and a combination thereof, more preferably a single bond. $L^{B71}$, $L^{B72}$ and $L^{B73}$ may be substituted or unsubstituted. Examples of the substituent are the same as those of the group represented by $L^B$ in the formula (B) and preferable examples are also the same.

Y represents a nitrogen atom, 1,3,5-benzenetriyl group or 2,4,6-triazinetriyl group. 1,3,5-benzenetriyl group may have a substituent at a 2,4,6-position. Examples of the substituent are an alkyl group, an aromatic hydrocarbon ring group and a halogen atom.

Specific examples of the nitrogen-containing 5-membered derivative represented by the formula (B) or (B') will be shown below. However, the nitrogen-containing 5-membered derivative is not limited to the exemplary compounds shown below.

[Chemical Formula 28]

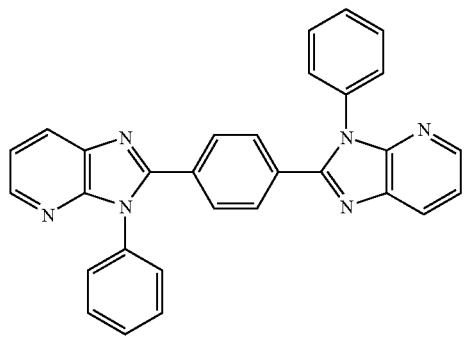

(B-1)

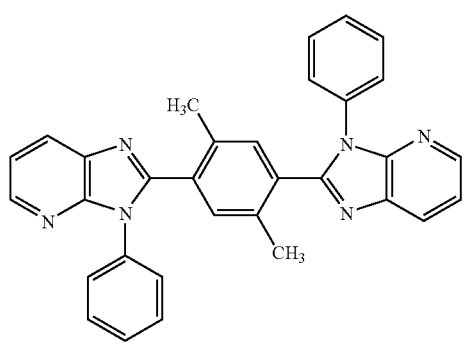

(B-2)

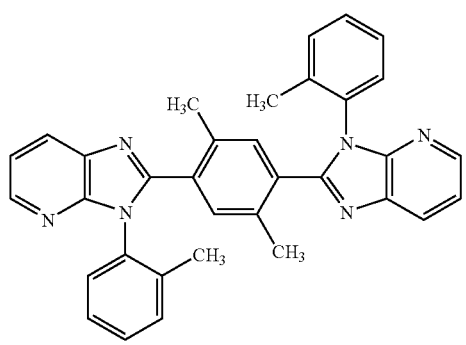

(B-3)

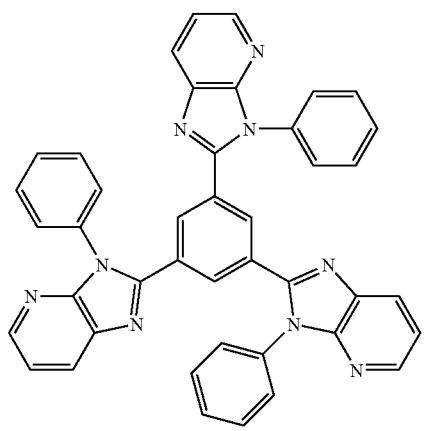

(B-4)

-continued
(B-5)
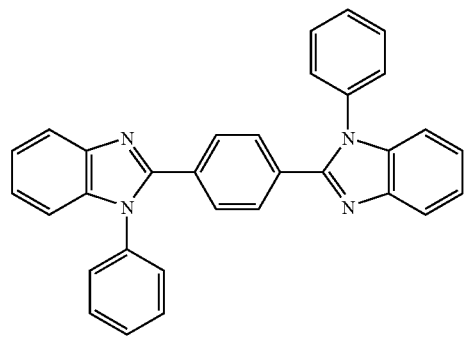
(B-6)
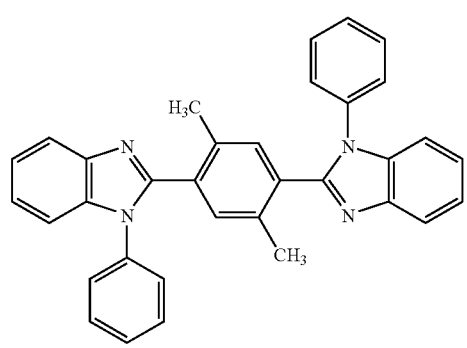
(B-7)
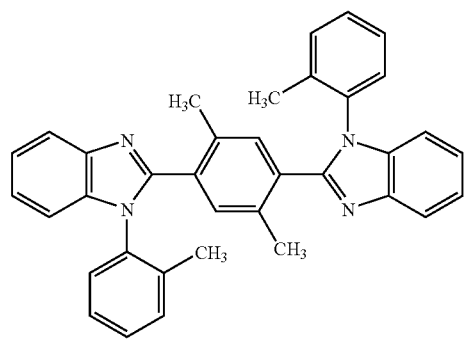
(B-8)
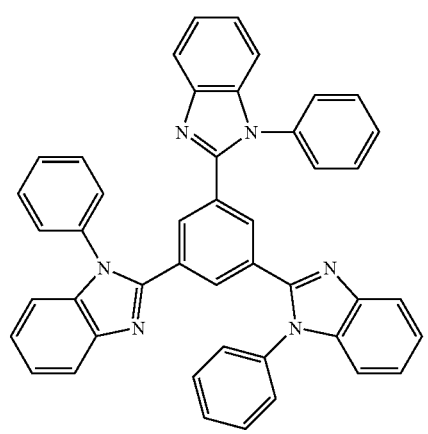
-continued
[Chemical Formula 29]
(B-9)
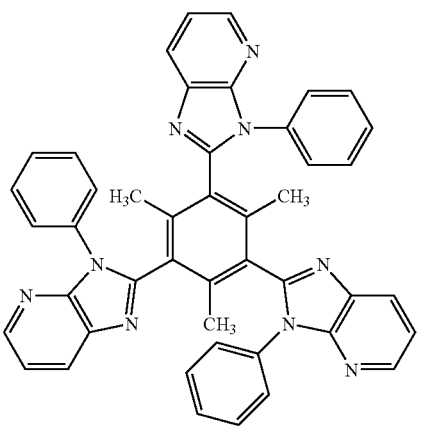
(B-10)
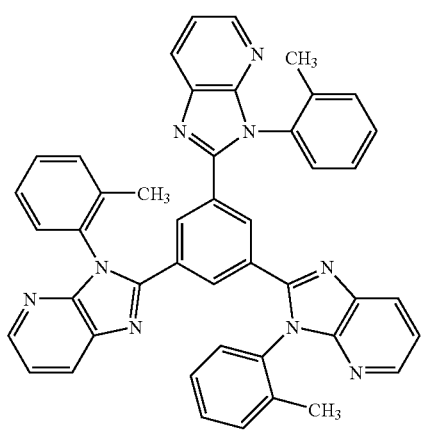
(B-11)
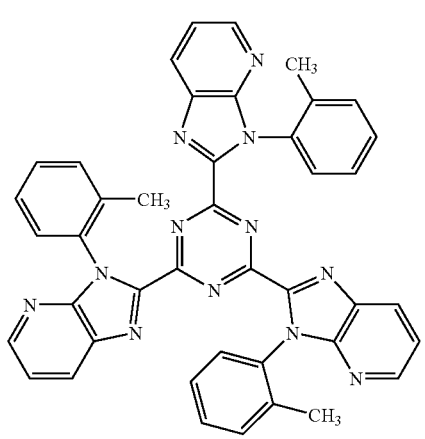

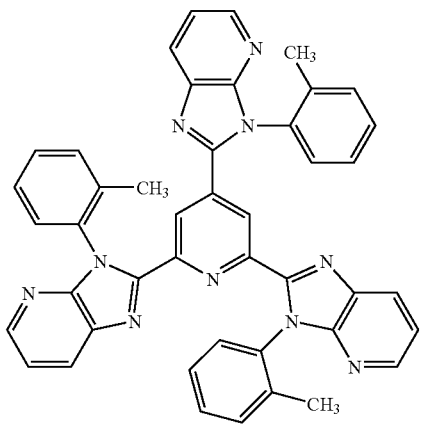

(B-12)

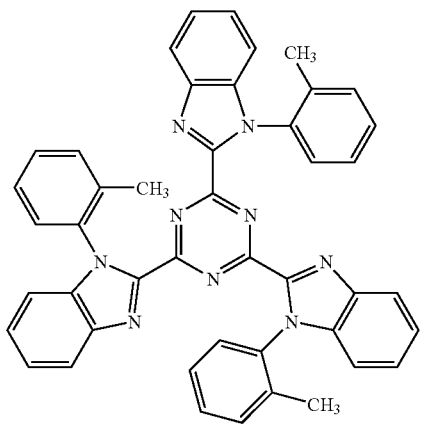

(B-15)

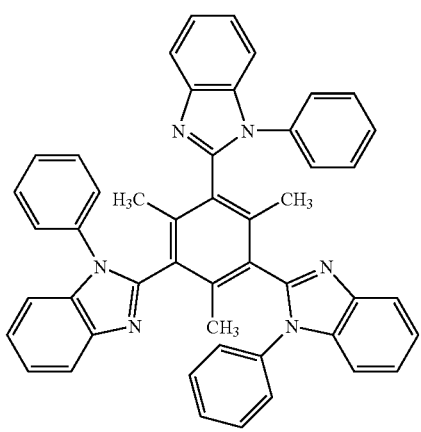

(B-13)

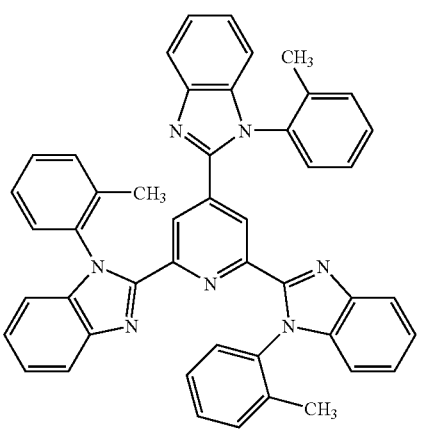

(B-16)

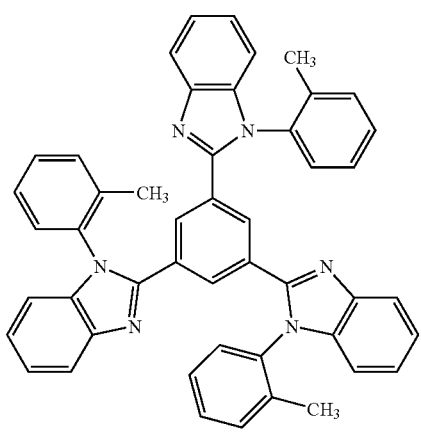

(B-14)

The compound forming the electron injecting layer and the electron transporting layer may be a compound in combination of a skeleton structure of an electron-deficient nitrogen-containing 5-membered ring or an electron-deficient nitrogen-containing 6-membered ring, a substituted or unsubstituted indole skeleton structure, a substituted or unsubstituted carbazole skeleton structure and a substituted or unsubstituted azacarbazole skeleton structure. The skeleton structure of an electron-deficient nitrogen-containing 5-membered ring or an electron-deficient nitrogen-containing 6-membered ring is preferably a skeleton structure of pyridine, pyrimidine, pyrazine, triazine, triazoles, oxadiazole, pyrazole, imidazoles, quinoxaline and pyrrole, and a molecular skeleton structure of benzimidazoles, imidazopyridine and the like that the above skeleton structures are mutually condensed. Among these combinations, a skeleton structure of pyridine, pyrimidine, pyrazine and triazine and a skeleton structure of carbazole, indole, azacarbazole and quinoxaline are preferable. The above skeleton structure may be substituted or unsubstituted.

Examples of the electron transporting compound are shown below.
[Chemical Formula 30]
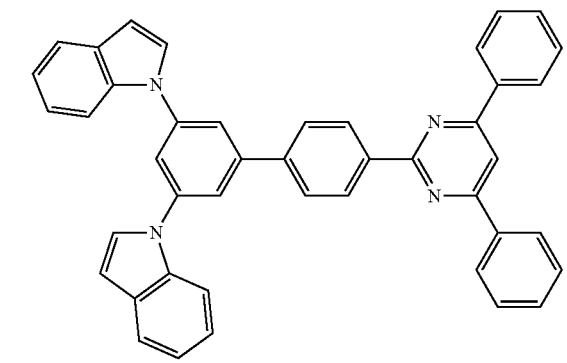
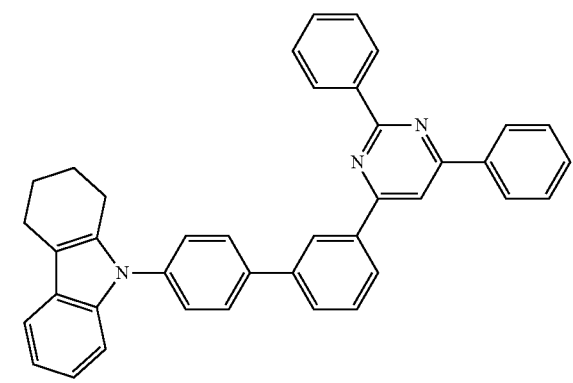
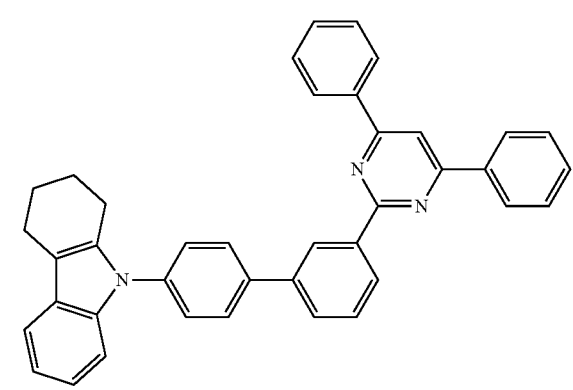
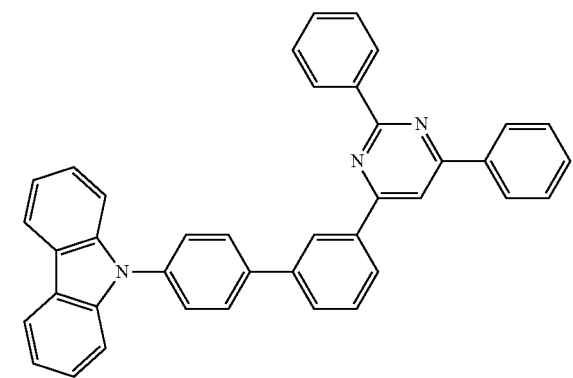
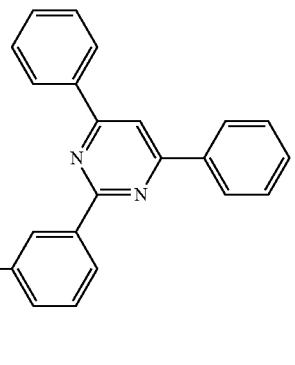
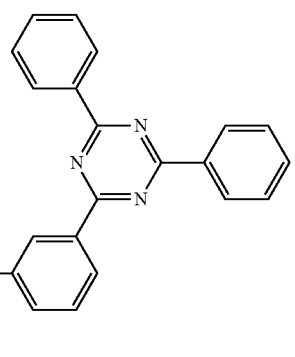
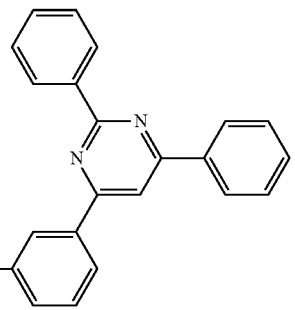
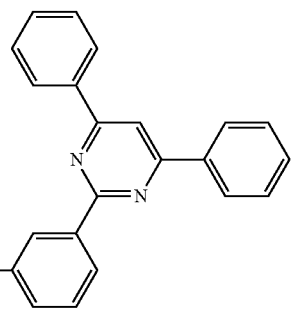

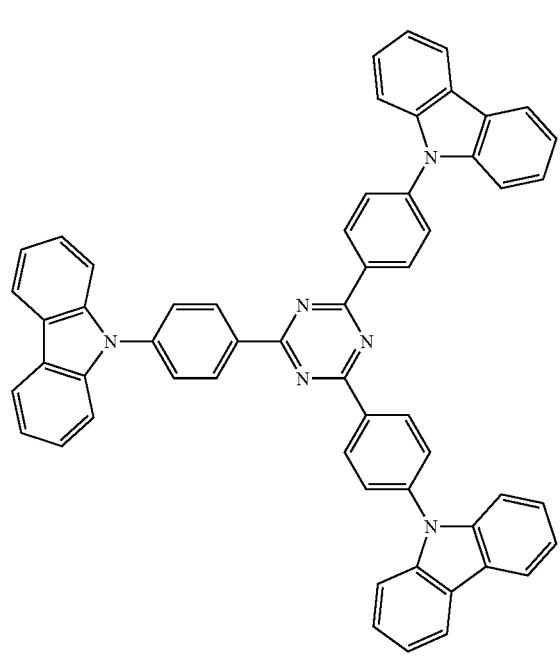
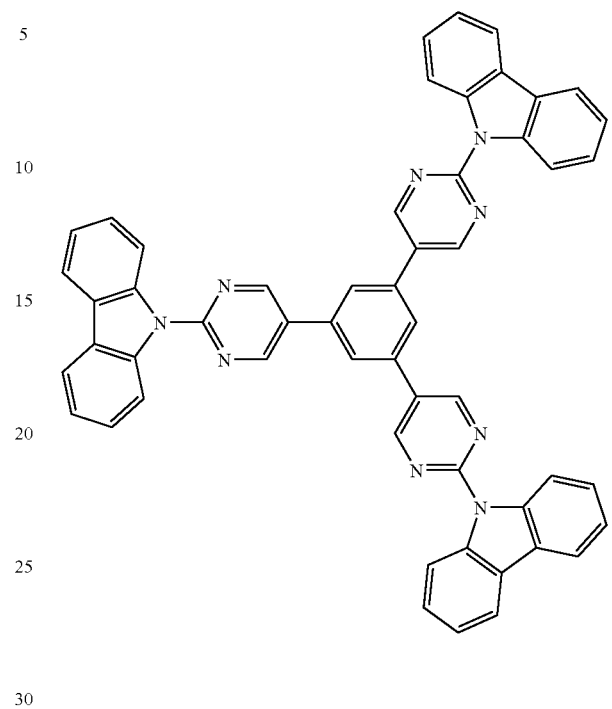
[Chemical Formula 31]
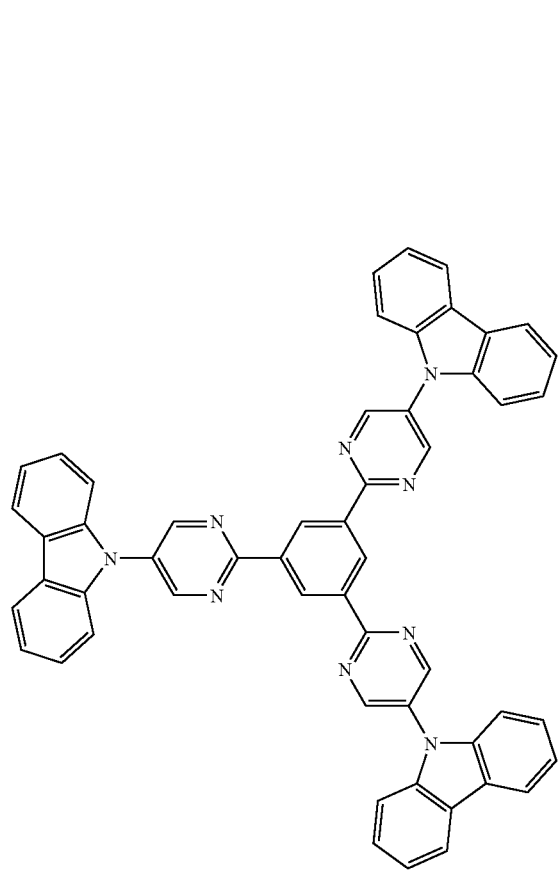
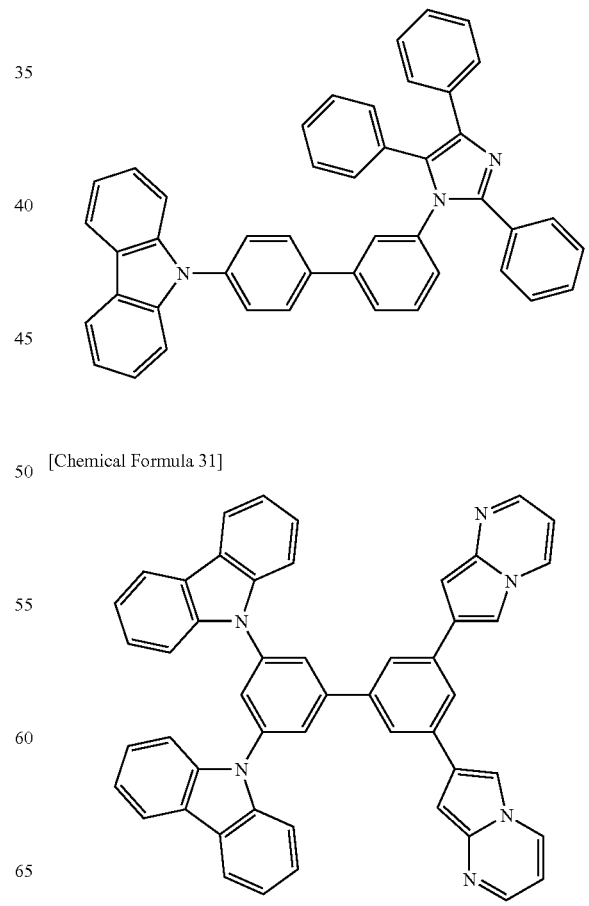

-continued

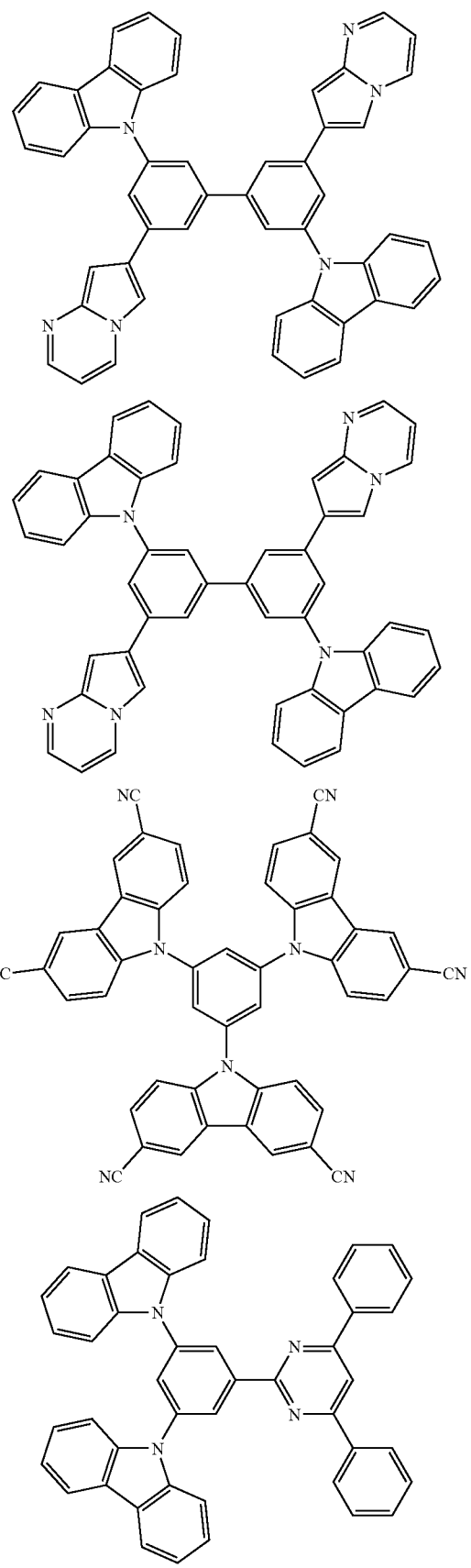

-continued

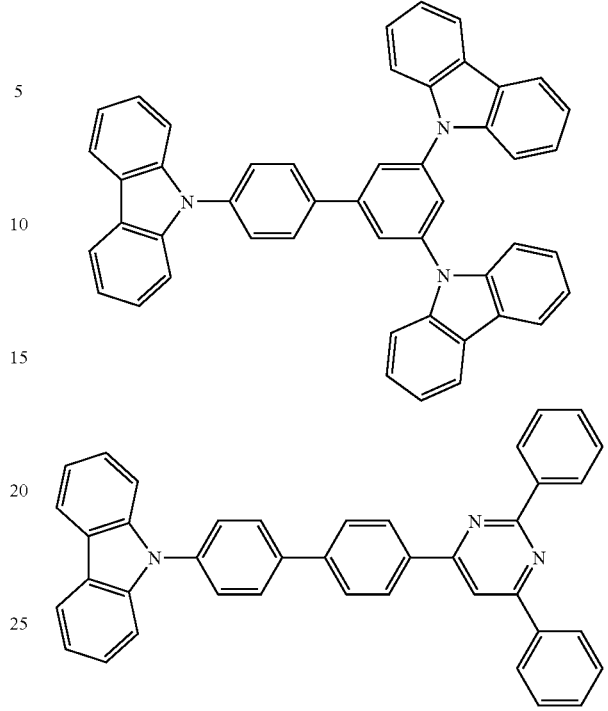

The electron injecting layer and the electron transporting layer may be a single layer structure formed by one or more materials selected from the above materials, or a multi-layer structure formed by a plurality of layers that have the same composition or different composition. The electron injecting layer and the electron transporting layer are preferably π electron-deficient nitrogen-containing hetero ring group.

The electron injecting layer preferably contains an inorganic compound such as an insulator or a semiconductor in addition to the nitrogen-containing cyclic derivative. Such an insulator or a semiconductor, when contained in the electron injecting layer, can effectively prevent a current leak, thereby enhancing electron injectability of the electron injecting layer.

As the insulator, it is preferable to use at least one metal compound selected from the group consisting of an alkali metal chalcogenide, an alkali earth metal chalcogenide, a halogenide of alkali metal and a halogenide of alkali earth metal. A configuration in which the electron injecting layer is formed by these alkali metal chalcogenide and the like is advantageous in that the electron injecting property is further improved. Specifically, preferable examples of the alkali metal chalcogenide are $Li_2O$, $K_2O$, $Na_2S$, $Na_2Se$ and $Na_2O$, while preferable example of the alkali earth metal chalcogenide are CaO, BaO, SrO, BeO, BaS and CaSe. Preferable examples of the halogenide of the alkali metal are LiF, NaF, KF, LiCl, KCl and NaCl. Preferable examples of the halogenide of the alkali earth metal are fluorides such as $CaF_2$, $BaF_2$, $SrF_2$, $MgF_2$ and $BeF_2$, and halogenides other than the fluoride.

Examples of the semiconductor are one of or a combination of two or more of an oxide, a nitride or an oxidized nitride containing at least one element selected from Ba, Ca, Sr, Yb, Al, Ga, In, Li, Na, Cd, Mg, Si, Ta, Sb and Zn. An inorganic compound for forming the electron injecting layer is preferably a microcrystalline or amorphous semiconductor film. When the electron injecting layer is formed of such insulator film, more uniform thin film can be formed, thereby reducing pixel defects such as a dark spot. Examples of such an inorganic compound are the above-described alkali metal chalcogenide, alkali earth metal chalcogenide, halogenide of the alkali metal and halogenide of the alkali earth metal.

The electron injecting layer according to the invention may preferably contain the above-described reductive dopant.

In the aspect of the invention, an electron-receiving substance is preferably bonded to or added to the first or second hole transporting layer.

With this arrangement, such effects as described in the patents below provide low-voltage driving and highly efficient emission.

As the electron-receiving substance to be added or bonded to the first hole transporting layer or the second hole transporting layer of the invention, an inorganic compound such as p-type Si and p-type SiC, an electron-receiving inorganic oxide such as molybdenum oxide and an electron-receiving organic compound such as TCNQ derivatives can be suitably used in addition to hexaazatriphenylene derivatives and the like described in Japanese Patent Publication No. 3614405, No. 3571977 or U.S. Pat. No. 4,780,536.

BEST MODE FOR CARRYING OUT THE INVENTION

Figure 1:
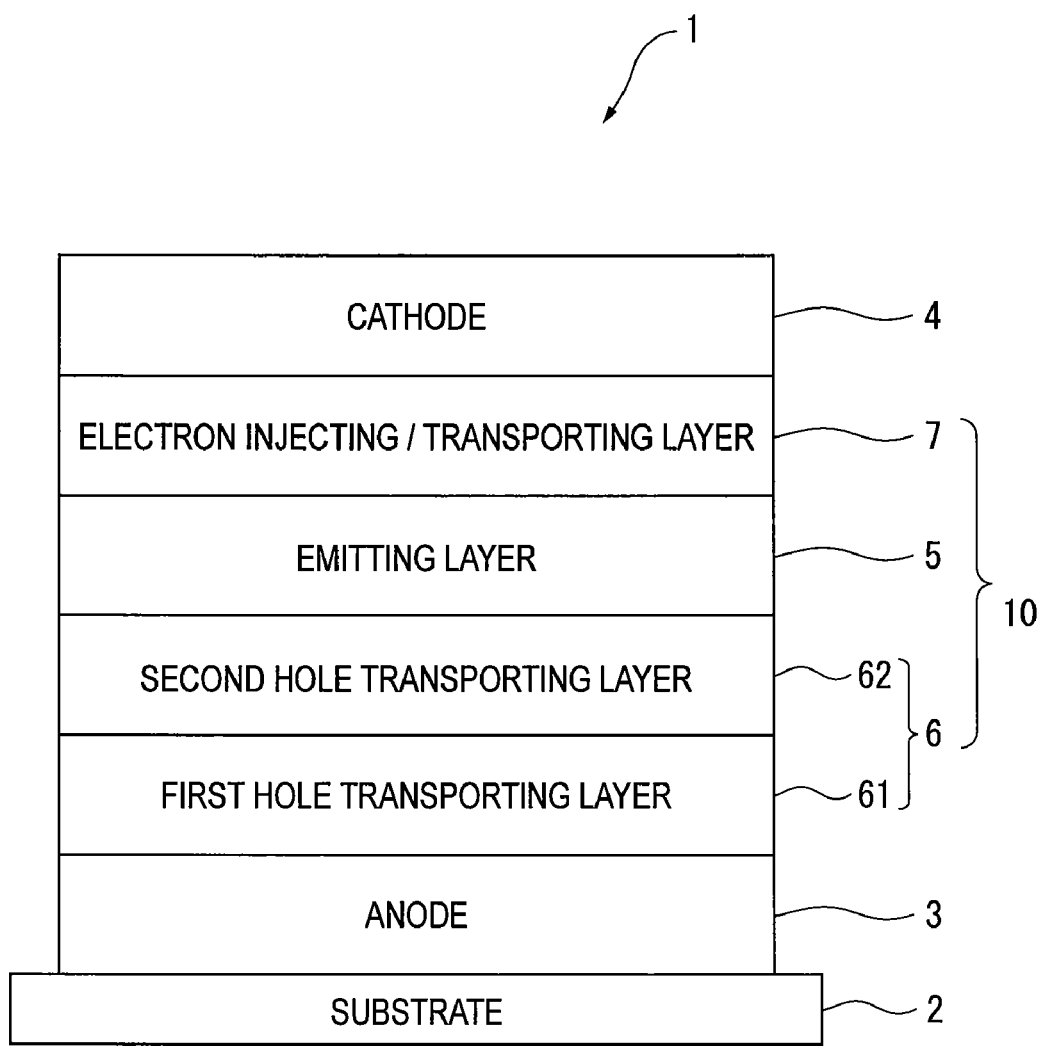
FIG. 1 shows an outline structure of an organic electroluminescence device according to an exemplary embodiment of the invention.

Preferable exemplary embodiment(s) of the invention will be described below.

[Organic Electroluminescence Device]

FIG. 1 shows a schematic arrangement of an organic EL device according to an exemplary embodiment of the invention.

An organic EL device 1 includes a transparent substrate 2, an anode 3, a cathode 4 and an emitting layer 5 interposed between the anode 3 and the cathode 4. A hole transporting layer 6 is interposed between the emitting layer 5 and the anode 3, the hole transporting layer 6 including a first hole transporting layer 61 and a second hole transporting layer 62 that are sequentially layered on the anode 3. An electron injecting/transporting layer 7 is interposed between the emitting layer 5 and the cathode 4. The organic thin film layer 10 includes the electron injecting/transporting layer 7, emitting layer 5 and hole transporting layer 6.

The first hole transporting layer 61 contains the compound represented by the above formula (1) and the second hole transporting layer 62 contains at least one of the compounds represented by the above formulae (2) to (5).

The compounds represented by the above formulae (1) to (5) contained in the first and second hole transporting layers are not limited to a single type of compound. In other words, the first and second hole transporting layers may contain a plurality of the compounds represented by the above formulae (1) to (5).

The anode of the organic EL device of the invention injects a hole into the hole injecting layer or the hole transporting layer, so that it is favorable in terms of efficiency that the anode has a work function of 4.5 eV or higher. Exemplary materials for the anode of the invention are indium-tin oxide (ITO), tin oxide (NESA), gold, silver, platinum and copper. In order to inject electrons into the electron injecting layer or the emitting layer, a material having smaller work function is more preferably used for the cathode. Although the material for the cathode is subject to no specific limitation, examples of the material are indium, aluminum, magnesium, alloy of magnesium and indium, alloy of magnesium and aluminum, alloy of aluminum and lithium, alloy of aluminum, scandium and lithium, alloy of magnesium and silver and the like.

A method of forming each of the layers in the organic EL device according to the aspect of the invention is not particularly limited.

The layers may be formed by a conventional coating method such as vacuum deposition, molecular beam epitaxy (MBE method) and coating methods using a solution such as a dipping, spin coating, casting, bar coating and roll coating.

Although the thickness of each organic layer of the organic EL device according to the aspect of the invention is not particularly limited, the thickness is generally preferably in a range of several nanometers to 1 μm because an excessively-thinned film is likely to entail defects such as a pin hole while an excessively-thickened film requires high voltage to be applied and deteriorates efficiency.

An arrangement of the organic EL device according to the aspect of the invention is not particularly limited to the arrangement shown in FIG. 1.

For instance, a hole injecting layer may be provided between the first hole transporting layer and the anode 3.

The hole transporting layer 6 may be a single layer instead of double layer structure including the first hole transporting layer 61 and the second hole transporting layer 62.

A hole blocking layer may be provided between the emitting layer 5 and the electron injecting/transporting layer 7.

With the hole blocking layer, holes can be trapped in the emitting layer 5, thereby enhancing probability of charge recombination in the emitting layer 5 and improving luminous efficiency.

EXAMPLES

Next, the invention will be described in further detail by exemplifying Example(s) and Comparative(s). However, the invention is not limited by the description of Example(s).

Example 1

A glass substrate (size: 25 mm×75 mm×1.1 mm thick) having an ITO transparent electrode (manufactured by Asahi Glass Co., Ltd) was ultrasonic-cleaned in isopropyl alcohol for five minutes, and then UV/ozone-cleaned for 30 minutes.

After the glass substrate having the transparent electrode line was cleaned, the glass substrate was mounted on a substrate holder of a vacuum deposition apparatus, so that an 80-nm thick film of a compound HT0 was initially formed by resistance heating deposition to cover a surface of the glass substrate where the transparent electrode line was provided. This HT0 film serves as the first hole transporting layer.

After the film-formation of the first hole transporting layer, a 20-nm thick film of an electron-blocking compound HT1 was formed by resistance heating deposition to cover the film of the first hole transporting layer. This HT1 film functions as the second hole transporting layer.

Further, on the second hole transporting layer, a compound H1 as a host material and a compound D1 as a phosphorescent emitting material were co-evaporated by resistance heating deposition to form a 30-nm thick film. A concentration of the compound D1 was 7.5 mass %. This co-evaporated layer serves as the emitting layer.

After the film-formation of the emitting layer, a 10-nm thick film of a compound ETM1 was formed on the film of the emitting layer and a 20-nm thick film of a compound ETM2 was formed on the ETM1 film. The ETM1 film and ETM2 film respectively serve as the first electron transporting layer and the second transporting layer.

Then, a 0.5-nm thick film of LiF was formed as an electron-injecting electrode (cathode) at a film-forming speed of 0.1 Å/min. Metal (Al) was vapor-deposited on the LiF film to form a 150-nm thick metal cathode, thereby providing the organic EL device.

[Chemical Formula 32]

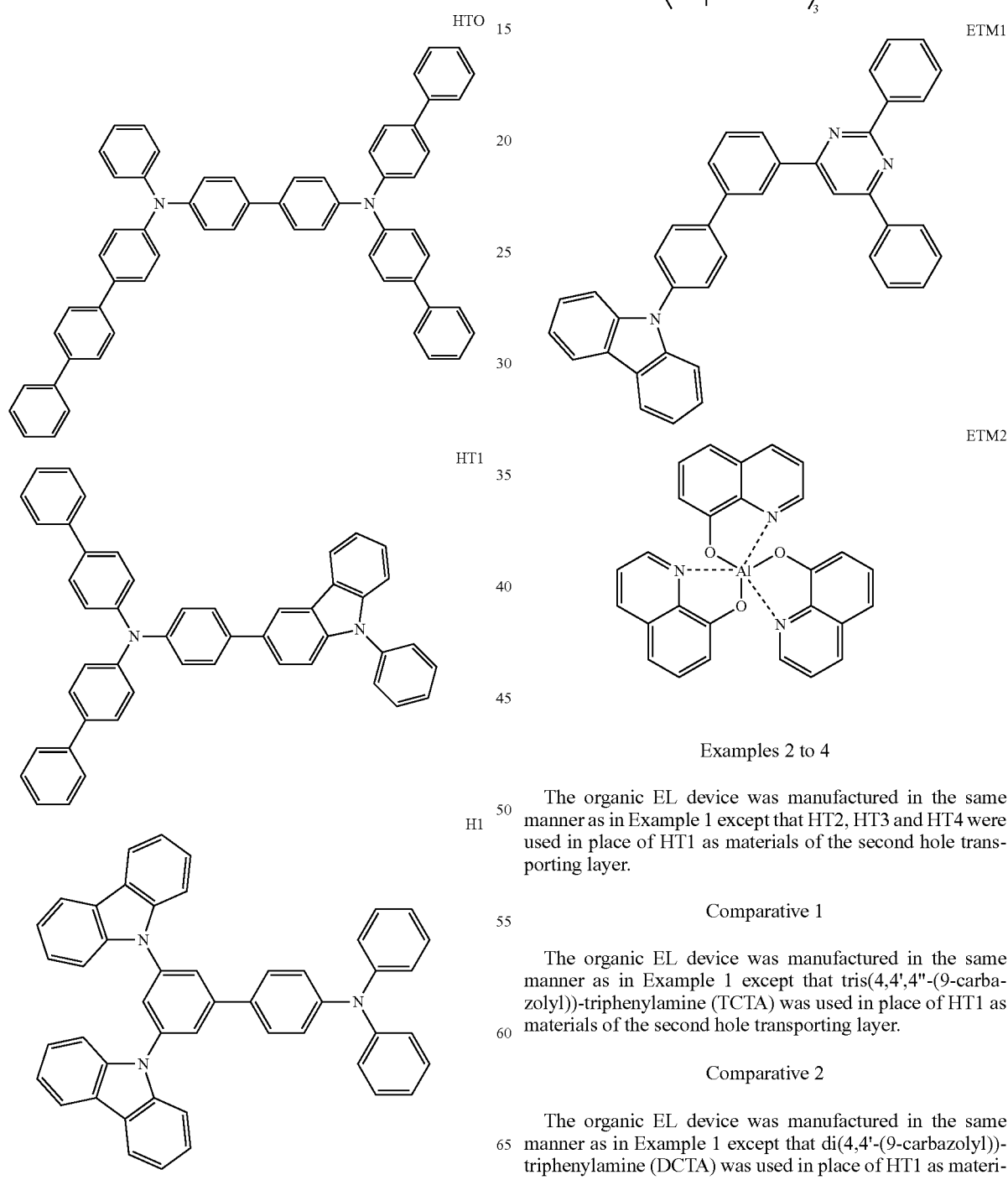

Examples 2 to 4

The organic EL device was manufactured in the same manner as in Example 1 except that HT2, HT3 and HT4 were used in place of HT1 as materials of the second hole transporting layer.

Comparative 1

The organic EL device was manufactured in the same manner as in Example 1 except that tris(4,4',4''-(9-carbazolyl))-triphenylamine (TCTA) was used in place of HT1 as materials of the second hole transporting layer.

Comparative 2

The organic EL device was manufactured in the same manner as in Example 1 except that di(4,4'-(9-carbazolyl))-triphenylamine (DCTA) was used in place of HT1 as materials of the second hole transporting layer.

[Chemical Formula 33]
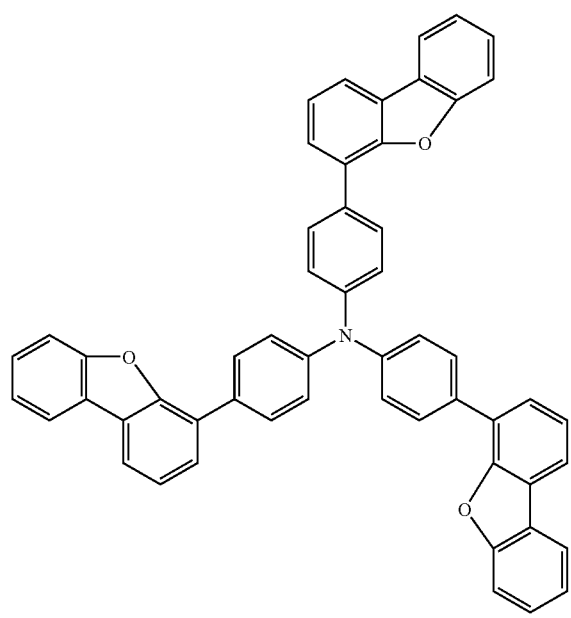
HT2
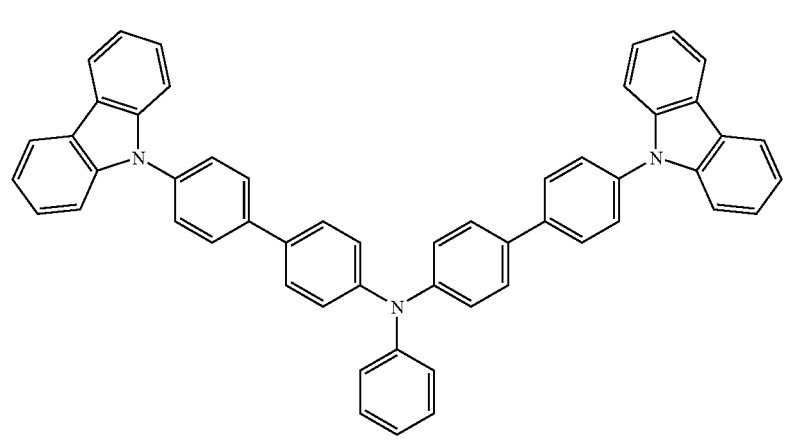
HT3
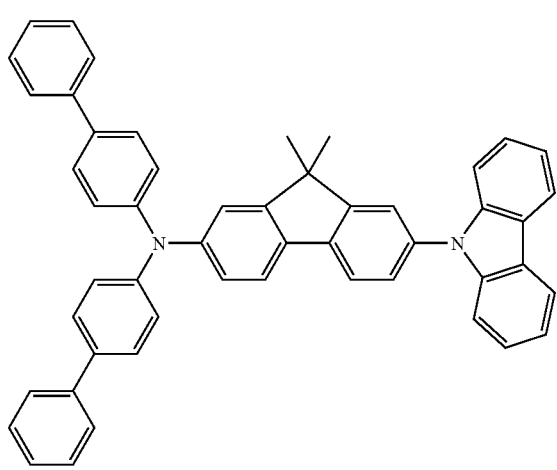
HT4

-continued

TCTA

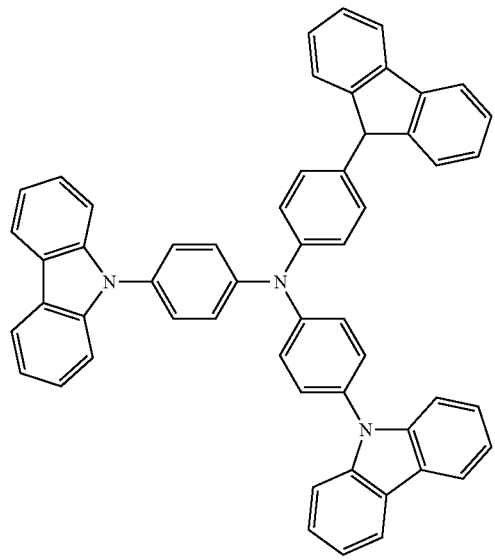

DCTA

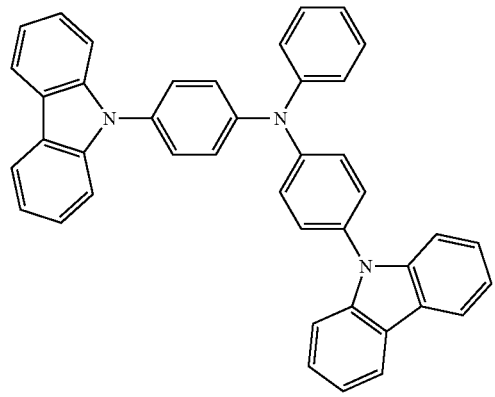

Comparative 3

The organic EL device was manufactured in the same manner as in Example 1 except that the hole transporting layer is a 100-nm thick single-layered film of HT3 without laminating the first and second hole transporting layers.

Comparative 4

The organic EL device was manufactured in the same manner as in Example 1 except that the hole transporting layer is a 100-nm thick single-layered film of HT4, not provided with the first and second hole transporting layers.

Example 5

A glass substrate (size: 25 mm×75 mm×1.1 mm thick) having an ITO transparent electrode (manufactured by Asahi Glass Co., Ltd) was ultrasonic-cleaned in isopropyl alcohol for five minutes, and then UV/ozone-cleaned for 30 minutes.

After the glass substrate having the transparent electrode line was cleaned, the glass substrate was mounted on a substrate holder of a vacuum deposition apparatus, so that 10-nm thick film of a compound HT0 was initially formed by resistance heating deposition to cover a surface of the glass substrate where the transparent electrode line was provided. This HT0 film serves as the first hole transporting layer.

After the film-formation of the first hole transporting layer, 10-nm thick film of an electron-blocking compound HT4 was formed by resistance heating deposition to cover the film of the first hole transporting layer. This HT4 film serves as the second hole transporting layer.

Further, on the second hole transporting layer, a compound H2 as a host material and a compound D2 as a phosphorescent emitting material were co-evaporated by resistance heating deposition to form a 40-nm thick film. A concentration of the compound D2 was 10.0 mass %. This co-evaporated layer serves as the emitting layer.

After the film-formation of the emitting layer, a 10-nm thick film of a compound ETM1 was formed on the film of the emitting layer and a 40-nm thick film of a compound ETM2 was formed on the ETM1 film. The ETM1 film and ETM2 film respectively serve as the first electron transporting layer and the second transporting layer.

Then, a 0.5-nm thick film of LiF was formed as an electron-injecting electrode (cathode) at a film-forming speed of 0.1 Å/min. Metal (Al) was vapor-deposited on the LiF film to form a 150-nm thick metal cathode, thereby providing the organic EL device.

[Chemical Formula 34]

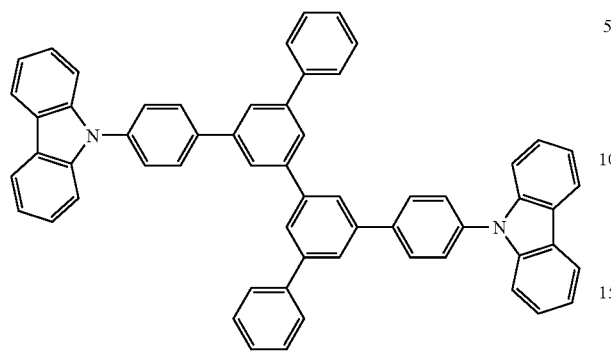

H2

[Chemical Formula 35]

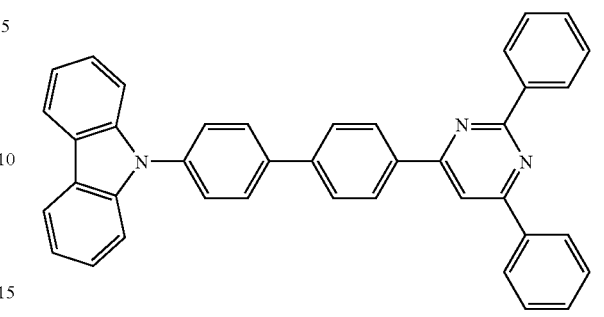

H3

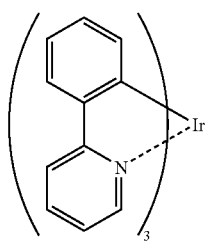

D2

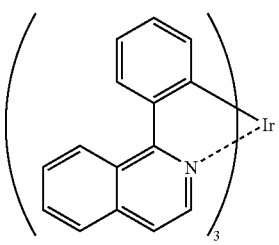

D3

Example 6

A glass substrate (size: 25 mm×75 mm×1.1 mm thick) having an ITO transparent electrode (manufactured by Asahi Glass Co., Ltd) was ultrasonic-cleaned in isopropyl alcohol for five minutes, and then UV/ozone-cleaned for 30 minutes.

After the glass substrate having the transparent electrode line was cleaned, the glass substrate was mounted on a substrate holder of a vacuum deposition apparatus, so that 20-nm thick film of a compound HT0 was initially formed by resistance heating deposition to cover a surface of the glass substrate where the transparent electrode line was provided. This HT0 film serves as the first hole transporting layer.

After the film-formation of the first hole transporting layer, 10-nm thick film of an electron-blocking compound HT4 was formed by resistance heating deposition to cover the film of the first hole transporting layer. This HT4 film serves as the second hole transporting layer.

Further, on the second hole transporting layer, a compound H3 as a host material and a compound D3 as a phosphorescent emitting material were co-evaporated by resistance heating deposition to form a 40-nm thick film. A concentration of the compound D3 was 10.0 mass %. This co-evaporated layer serves as the emitting layer.

After the film-formation of the emitting layer, a 40-nm thick film of a compound ETM2 was formed. This ETM2 film serves as the second electron transporting layer.

Then, a 0.5-nm thick film of LiF was formed as an electron-injecting electrode (cathode) at a film-forming speed of 0.1 Å/min. Metal (Al) was vapor-deposited on the LiF film to form a 150-nm thick metal cathode, thereby providing the organic EL device.

[Evaluation of Organic EL Device in Properties and Lifetime]

The organic EL device as manufactured above was made to emit light at initial luminance intensity of 1000 cd/m². Change in luminance intensity over time was measured and the time when luminance intensity was reduced to half was made to be half life.

Voltage at 10 mA/cm², current efficiency and time until half-life measured for each organic EL device are shown in Table 1 below. Moreover, glass-transition temperature Tg of the hole transporting material, excited triplet energy gap Eg(T) of the hole transporting material and the maximum emission wavelength λ of each of the organic EL devices are shown in Table 1.

TABLE 1

|  | Voltage (V) | Current efficiency (cd/A) | time until half-life (hours) | Tg (° C.) | Eg (T) (eV) | λ (nm) |
|---|---|---|---|---|---|---|
| Example 1 | 8.4 | 17.8 | 830 | 116 | 2.58 | 481 |
| Example 2 | 7.3 | 24.1 | 954 | 130 | 2.62 | 481 |
| Example 3 | 8.2 | 29.5 | 997 | 151 | 2.60 | 482 |
| Example 4 | 6.8 | 27.3 | 673 | 139 | 2.56 | 482 |
| Example 5 | 6.8 | 54.8 | 5000 | 139 | 2.56 | 516 |
| Example 6 | 5.5 | 8.6 | 8000 | 139 | 2.56 | 628 |
| Comparative 1 | 8.4 | 30.8 | 87 | 152 | 2.93 | 481 |
| Comparative 2 | 8.3 | 33.4 | 130 | 111 | 2.86 | 481 |
| Comparative 3 | 9.3 | 25.2 | 524 | 151 | 2.60 | 482 |
| Comparative 4 | 8.3 | 22.6 | 346 | 139 | 2.56 | 482 |

As shown in Table 1, although being inferior in efficiency due to low Eg(T), the organic EL devices of Examples 1 to 4 in which the first and second hole transporting layers were formed using the predetermined compounds of the invention provided outstanding advantages that life time was five times or more and voltage was equal to or lower than a typical organic EL device of Comparatives 1 and 2 in which TCTA or DCTA served as a charge blocking layer. In Examples 3 and 4 in which the hole transporting layer is provided with laminated layers, life time was improved approximately two times more than Comparatives 3 and 4 in which the hole transporting layer is provided with a single layer of corresponding compounds.

Since the second hole transporting layer was formed using the predetermined compound of the invention, triplet energy gap was higher than 2.5 eV, thereby providing efficient emission. Further, since the wavelength in the visible region is not significantly absorbed, the predetermined compound of the invention does not emit bluish light as the copper complex compound is used.

The invention claimed is:

1. An organic EL device, comprising:

an anode;

a cathode; and an organic thin-film layer interposed between the anode and the cathode, wherein the organic thin-film layer comprises: an emitting layer containing a host material and a phosphorescent material; and a hole transporting layer that is provided adjacent to the anode relative to the emitting layer, wherein the hole transporting layer comprises a first hole transporting layer and a second hole transporting layer that are sequentially layered on the anode, the first hole transporting layer containing an amino compound substituted by an aromatic substituent represented by a formula (1) below and the second hole transporting layer containing at least one of compounds represented by formulae (2) to (5) below,

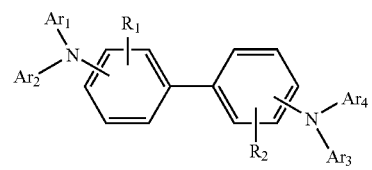
(1)

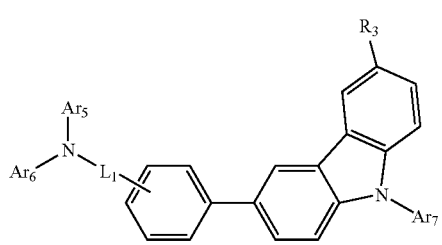
(2)

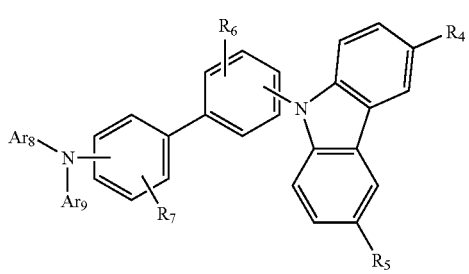
(3)

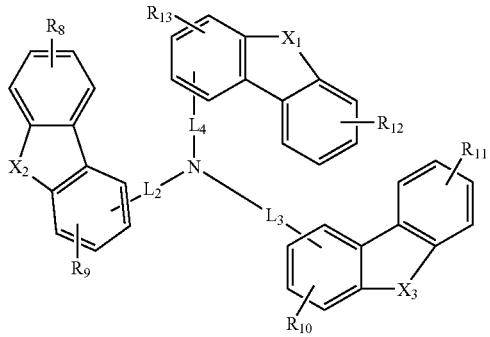
(4)

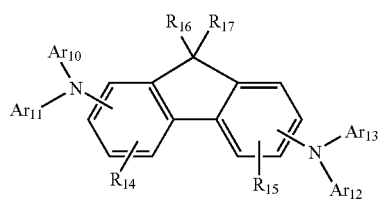
(5)

where: $Ar_1$ to $Ar_4$ each represent a substituted or unsubstituted phenyl group, a substituted or unsubstituted biphenyl group, a substituted or unsubstituted terphenyl group or a substituted or unsubstituted phenanthrene group;

$Ar_1$ and $Ar_3$ are adapted to be respectively bonded to $Ar_2$ and $Ar_4$ to form a ring;

$R_1$ and $R_2$ each represent hydrogen, a halogen atom, a substituted or unsubstituted alkyl group having 1 to 40 carbon atoms, a substituted or unsubstituted heterocyclic group having 3 to 20 carbon atoms, a substituted or unsubstituted non-condensed aryl group having 6 to 40 carbon atoms, a substituted or unsubstituted condensed aryl group having 6 to 12 carbon atoms, a substituted or unsubstituted condensed/non-condensed-mixed aryl group having 12 to 40 carbon atoms, a substituted or unsubstituted aralkyl group having 7 to 20 carbon atoms, a substituted or unsubstituted alkenyl group having 2 to 40 carbon atoms, a substituted or unsubstituted alkyl amino group having 1 to 40 carbon atoms, a substituted or unsubstituted aralkyl amino group having 7 to 60 carbon atoms, a substituted or unsubstituted alkylsilyl group having 3 to 20 carbon atoms, a substituted or unsubstituted arylsilyl group having 8 to 40 carbon atoms, a substituted or unsubstituted aralkylsilyl group having 8 to 40 carbon atoms, or a substituted or unsubstituted halogenated alkyl group having 1 to 40 carbon atoms; and where: $Ar_5$ to $Ar_{13}$ each represent a substituted or unsubstituted aryl group having 5 to 40 carbon atoms, a substituted or unsubstituted aromatic heterocyclic group having 5 to 40 carbon atoms, a substituted or unsubstituted aryl group having 8 to 40 carbon atoms bonded with an aromatic amino group, or a substituted or unsubstituted aryl group having 8 to 40 carbon atoms bonded with an aromatic heterocyclic group;

$Ar_5$, $Ar_8$, $Ar_{10}$ and $Ar_{12}$ are adapted to be respectively bonded to $Ar_6$, $Ar_9$, $Ar_{11}$ and $Ar_{13}$ to form a ring;

$L_1$ is a single bond or a linking group having 1 to 30 carbon atoms and $L_2$ to $L_4$ each are a linking group having 1 to 30 carbon atoms;

$R_3$ to $R_{17}$ each represent hydrogen, a halogen atom, a substituted or unsubstituted alkyl group having 1 to 40 carbon atoms, a substituted or unsubstituted heterocyclic group having 3 to 20 carbon atoms, a substituted or unsubstituted non-condensed aryl group having 6 to 40 carbon atoms, a substituted or unsubstituted condensed aryl group having 6 to 12 carbon atoms, a substituted or unsubstituted condensed/non-condensed-mixed aryl group having 12 to 40 carbon atoms, a substituted or unsubstituted aralkyl group having 7 to 20 carbon atoms, a substituted or unsubstituted alkenyl group having 2 to 40 carbon atoms, a substituted or unsubstituted alkyl amino group having 1 to 40 carbon atoms, a substituted or unsubstituted aralkyl amino group having 7 to 60 carbon atoms, a substituted or unsubstituted alkylsilyl group having 3 to 20 carbon atoms, a substituted or unsubstituted arylsilyl group having 8 to 40 carbon atoms, a substituted or unsubstituted aralkylsilyl group having 8 to 40 carbon atoms, or a substituted or unsubstituted halogenated alkyl group having 1 to 40 carbon atoms; and $X_1$ to $X_3$ each represent a sulfur atom, an oxygen atom or a monoaryl-substituted nitrogen atom.

2. The organic EL device according to claim 1, wherein the hole transporting layer is bonded to the emitting layer.

3. The organic EL device according to claim 1, wherein the phosphorescent material is a metal complex compound containing a metal selected from the group consisting of Ir, Pt, Os, Cu, Ru, Re and Au.

4. The organic EL device according to claim 3, wherein the phosphorescent material has an ortho-metal bond of a center metal atom and a carbon atom contained in a ligand.

5. The organic EL device according to claim 1, wherein an excited triplet energy of the host material is in a range of 2.0 eV to 3.2 eV.

6. The organic EL device according to claim 1, wherein the host material has a partial molecular structure represented by a formula (6) below,

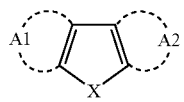

(6)

where: A1 or A2 represents a substituted or unsubstituted aromatic heterocyclic ring or aromatic hydrocarbon ring; and X represents a nitrogen atom, an oxygen atom or a sulfur atom.

7. The organic EL device according to claim 6, wherein the partial molecular structure represented by the formula (6) is one or more selected from formulae (7) to (24) below,

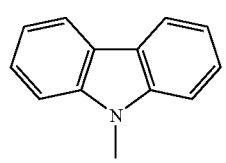

(7)

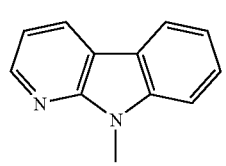

(8)

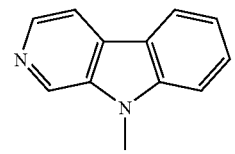

(9)

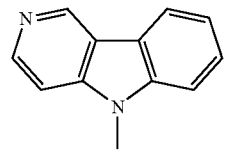

(10)

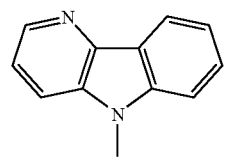

(11)

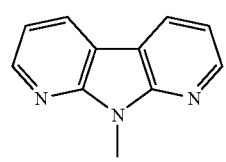

(12)

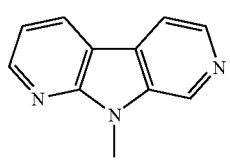

(13)

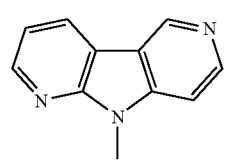

(14)

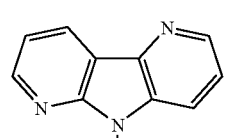

(15)

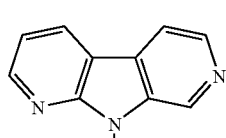

(16)

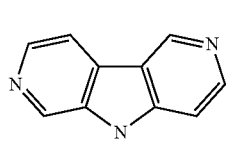

(17)

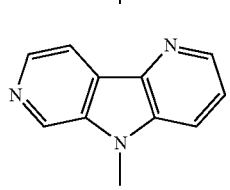

(18)

(19)

(20)

(21)

(22)

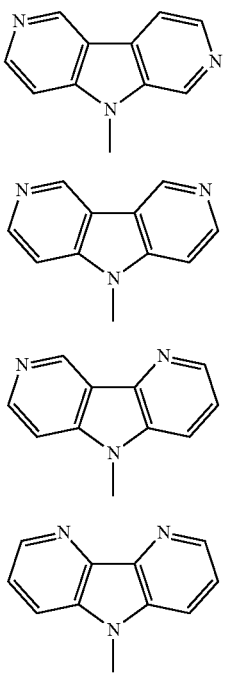

(23)

(24)

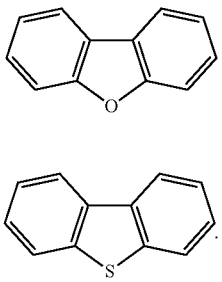

8. The organic EL device according to claim 1, wherein a reductive dopant is present at an interfacial region between the cathode and the organic thin-film layer.

9. The organic EL device according to claim 1, wherein an electron injecting layer is interposed between the emitting layer and the cathode, and comprises a nitrogen-containing cyclic derivative as a main component.

10. The organic EL device according to claim 1, wherein an electron-receiving substance is bonded to the hole transporting layer.

* * * * *